(12) United States Patent
Wilkinson et al.

(10) Patent No.: US 11,027,976 B2
(45) Date of Patent: Jun. 8, 2021

(54) FERROELASTIC CERAMIC COMPOSITIONS, APPLICATIONS THEREOF, AND RELATED METHODS

(71) Applicant: Colorado School of Mines, Golden, CO (US)

(72) Inventors: Taylor M. Wilkinson, Golden, CO (US); Matt Musselman, Golden, CO (US); Corinne E. Packard, Golden, CO (US)

(73) Assignee: Colorado School of Mines, Golden, CO (US)

( * ) Notice: Subject to any disclaimer, the term of this patent is extended or adjusted under 35 U.S.C. 154(b) by 0 days.

(21) Appl. No.: 16/206,360

(22) Filed: Nov. 30, 2018

(65) Prior Publication Data

US 2019/0218098 A1    Jul. 18, 2019

Related U.S. Application Data

(60) Provisional application No. 62/593,182, filed on Nov. 30, 2017.

(51) Int. Cl.
| | |
|---|---|
| C01B 25/37 | (2006.01) |
| C30B 29/22 | (2006.01) |
| F01D 5/14 | (2006.01) |
| F02B 77/08 | (2006.01) |

(52) U.S. Cl.
CPC ............. *C01B 25/37* (2013.01); *C30B 29/22* (2013.01); *F01D 5/147* (2013.01); *F02B 77/089* (2013.01); *C01P 2002/52* (2013.01); *C01P 2006/90* (2013.01)

(58) Field of Classification Search
CPC ........ C01B 25/37; F02B 77/089; F01D 5/147; F01D 5/288; F01D 5/286; C30B 29/22; C30B 29/32; C30B 29/30; C30B 29/14; C30B 9/00; C30B 7/00; C01P 2002/52; C01P 2006/90; F05D 2300/22
See application file for complete search history.

(56) References Cited

U.S. PATENT DOCUMENTS

| | | | | |
|---|---|---|---|---|
| 3,773,898 A | * | 11/1973 | Aizu et al. | H01G 7/025 |
| | | | | 423/263 |
| 2015/0259251 A1 | * | 9/2015 | Hill | C04B 35/44 |
| | | | | 252/62 |

OTHER PUBLICATIONS

Weber et al. Ferroelastic behavior and the monoclinic-to-orthorhombic phase transition in MP,O,4. Physical Review B vol. 11, No. 1 Feb. 1975.*

(Continued)

*Primary Examiner* — Noah S Wiese
(74) *Attorney, Agent, or Firm* — Dorsey & Whitney LLP

(57) ABSTRACT

An example ferroelastic ceramic composition includes at least one compound having a relative chemical formula of $A_X B_Y C_{(1-X-Y)} D$. Element A, element B, and element C are independently selected from different members of the group consisting of yttrium, lanthanum, cerium, praseodymium, neodymium, promethium, samarium, europium, gadolinium, terbium, dysprosium, holmium, erbium, thulium, ytterbium, and lutetium. Element D is selected from the group consisting of phosphate, niobate, and tungstate. X and Y are each equal to or greater than zero and less than one. X and Y are collective less than one.

19 Claims, 18 Drawing Sheets

(56) References Cited

OTHER PUBLICATIONS

Sarin et al. High-Temperature Properties and Ferroelastic Phase Transitions inRare-Earth Niobates (LnNbO4). J. Am. Ceram. Soc., 97[10] 3307-3319 (2014).*

Hay et al. Transformation plasticity in TbPO4and (Gd,Dy)PO4orthophosphates duringindentation of polycrystalline specimens. Journal of the European Ceramic Society 34 (2014) 773-781.*

Schatzmann, Michael T. et al., "Synthesis of monoclinic monazite, LaPO4, by direct precipitation", J. Mater. Chem., 19, Jun. 3, 2009, pp. 5720-5722.

Wilkinson, Taylor M. et al., "Indentation recovery in GdPO4 and observation of deformation twinning", AIP Advances, 6, Sep. 30, 2016, pp. 095029-1-095029-4.

* cited by examiner

FERROELASTIC CERAMIC COMPOSITIONS, APPLICATIONS THEREOF, AND RELATED METHODS

CROSS-REFERENCE TO RELATED APPLICATIONS

This application claims priority to U.S. Provisional Application No. 62/593,182 filed on Nov. 30, 2017, the disclosure of which is incorporated herein, in its entirety, by this reference.

GOVERNMENT LICENSE RIGHTS

This invention was made with Government support under DMR-1352499 awarded by the National Science Foundation (NSF). The Government has certain rights in the invention.

BACKGROUND

Interest is growing in emerging ceramics with unique behavior that makes them suited for applications in damping, sensing, and activation. For many of these applications, the amount of mechanical energy a material is able to store and release as well as the number of cycles achieved before failure are key metrics. Shape memory ceramics (SMCs), such as ceria-doped $ZrO_2$, have recently been shown to achieve higher dissipated energy than that of the well-known shape memory alloy (SMA) nickel titanium (NiTi). For example, SMCs exhibit a dissipated energy of 20-40 $MJ/m^3$ while NiTi exhibits a dissipated energy of 10-20 $MJ/m^3$. The dissipated energy values are maximized when the material size is small and the number of internal boundaries of the material is minimized to circumvent fracture, a common problem for brittle ceramics.

SMCs have the same operating principle as that of SMAs. For example, as a force is applied the material undergoes a phase transformation from a martensitic to an austenitic phase. The phase transition causes a morphological change within the crystal structure that can be recovered if the material is heated to elevated temperatures.

Superelasticity, which is a particularly attractive behavior for damping applications, has also been observed in SMCs via isothermal transformation at room temperature (i.e., a temperature which sits above the austenite finish temperature). Superelasticity in a material may be caused by a phase transformation of a material. However, phase transformation is not the only mechanism capable of producing superelasticity. For example, SMAs can also exhibit macroscopic superelastic behavior in the absence of a phase transformation caused by twinning (i.e., unstable twins form and extend to accommodate strain) and untwining (i.e., boundaries recede following removal of stress). This phenomenon, based on twinning and detwinning, is called ferroelasticity, and is distinct from the shape memory effect.

SUMMARY

In an embodiment, a ferroelastic ceramic composition is disclosed. The ferroelastic ceramic composition includes at least one compound having a relative chemical formula of $A_{(1-X-Y)}B_XC_YD$ wherein an element A, an element B, and an element C are independently selected from different members of the group consisting of yttrium, lanthanum, cerium, praseodymium, neodymium, promethium, samarium, europium, gadolinium, terbium, dysprosium, holmium, erbium, thulium, ytterbium, and lutetium; an element D is selected from the group consisting of a phosphate, a niobate, and a tungstate; X is greater than zero and less than one; Y is equal to or greater than zero and less than one; and X and Y are collectively less than one.

In an embodiment, a method of using a ferroelastic ceramic composition is disclosed. The method includes applying a load to at least a portion of a ferroelastic material, the ferroelastic material including at least one compound having a relative chemical formula of $A_{(1-X-Y)}B_XC_YD$, wherein an element A, an element B, and an element C are independently selected from different members of the group consisting of yttrium, lanthanum, cerium, praseodymium, neodymium, promethium, samarium, europium, gadolinium, terbium, dysprosium, holmium, erbium, thulium, ytterbium, and lutetium; an element D is selected from the group consisting of phosphate, niobate, or tungstate; X is a number that is equal to or greater than zero and less than one; Y is a number that is equal to or greater than zero and less than one; and X and Y are collectively less than one. The method also includes, after applying a load to at least a portion of the ferroelastic ceramic composition, removing Features from any of the disclosed embodiments may be used in combination with one another, without limitation. In addition, other features and advantages of the present disclosure will become apparent to those of ordinary skill in the art through consideration of the following detailed description and the accompanying drawings.

A graph that depicts similar graphs for single crystals of $EuPO_4$ and $TbPO_4$ at room temperature is not shown.

Figure 4A:
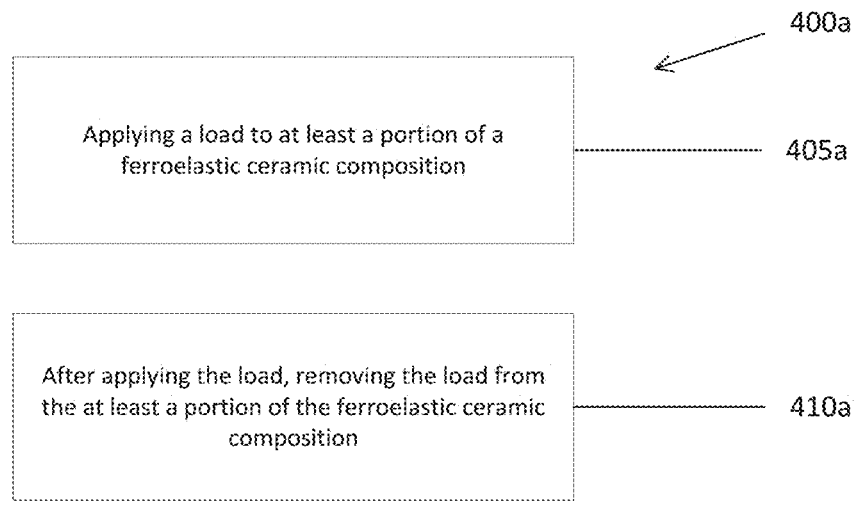

FIG. 4A is a flow chart of an example method 400a of using any of the ferroelastic ceramic compositions disclosed herein.

Figure 4B:
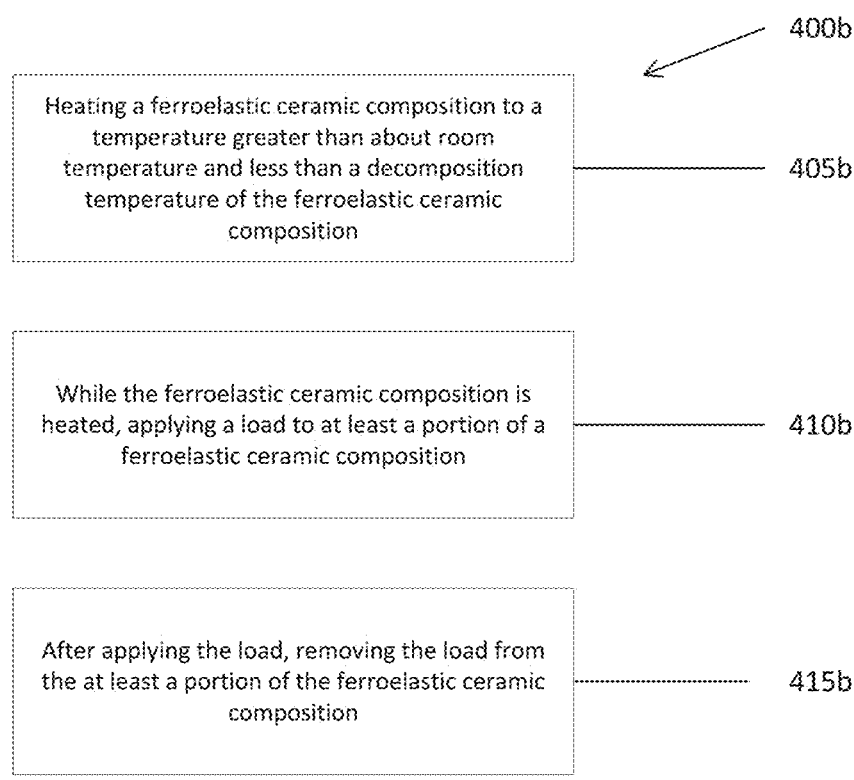

FIG. 4B is a flow chart of an example method 400b of using any of the ferroelastic ceramic compositions disclosed herein.

Figure 5:
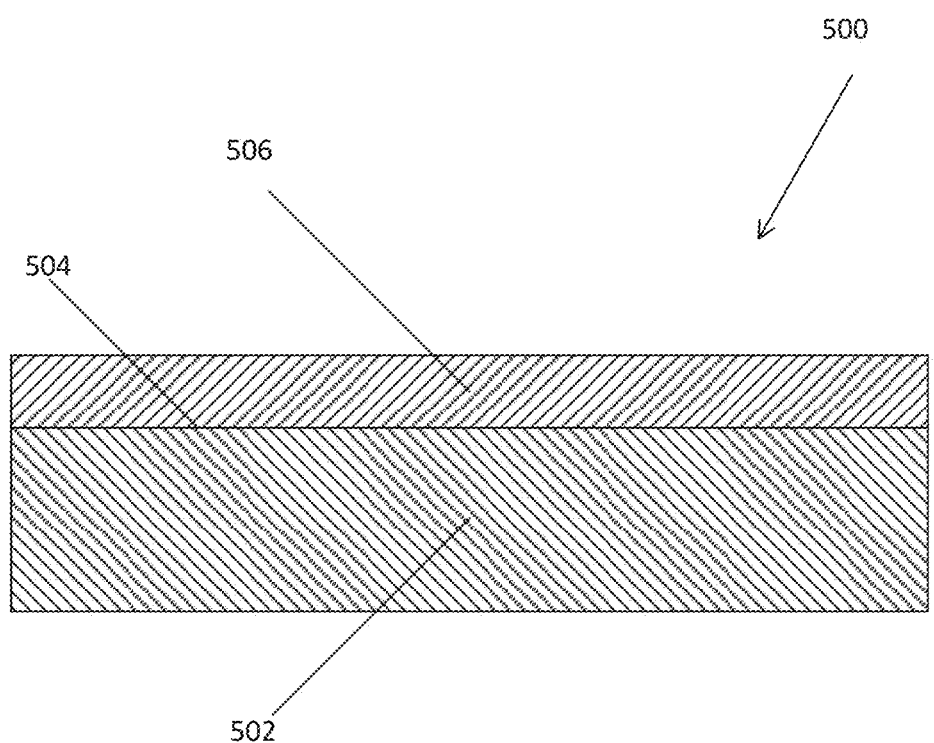

FIG. 5 is a schematic cross-sectional view of a portion of an engine or turbine 500, according to an embodiment.

Figure 6A:
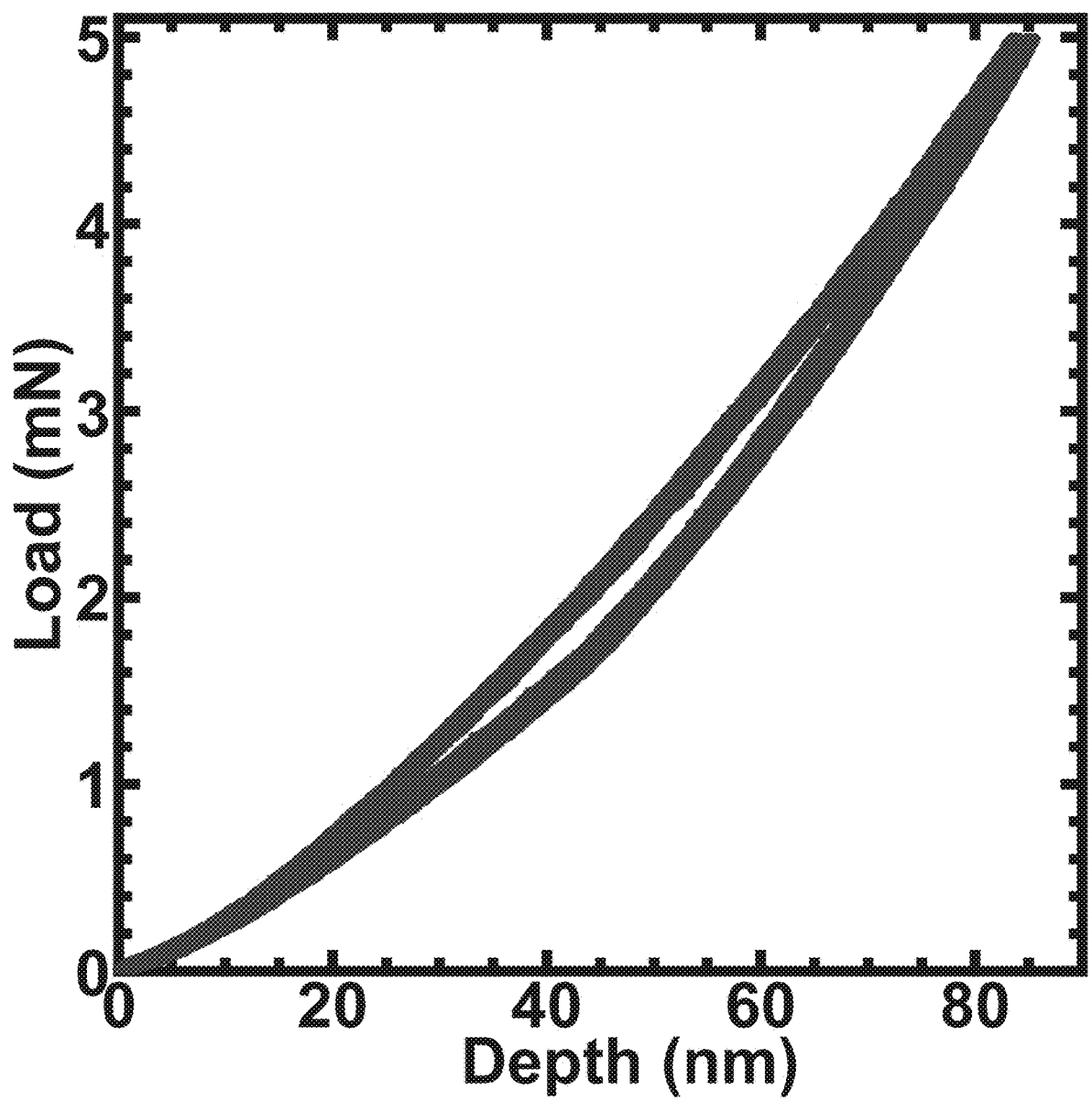
Figure 6B:
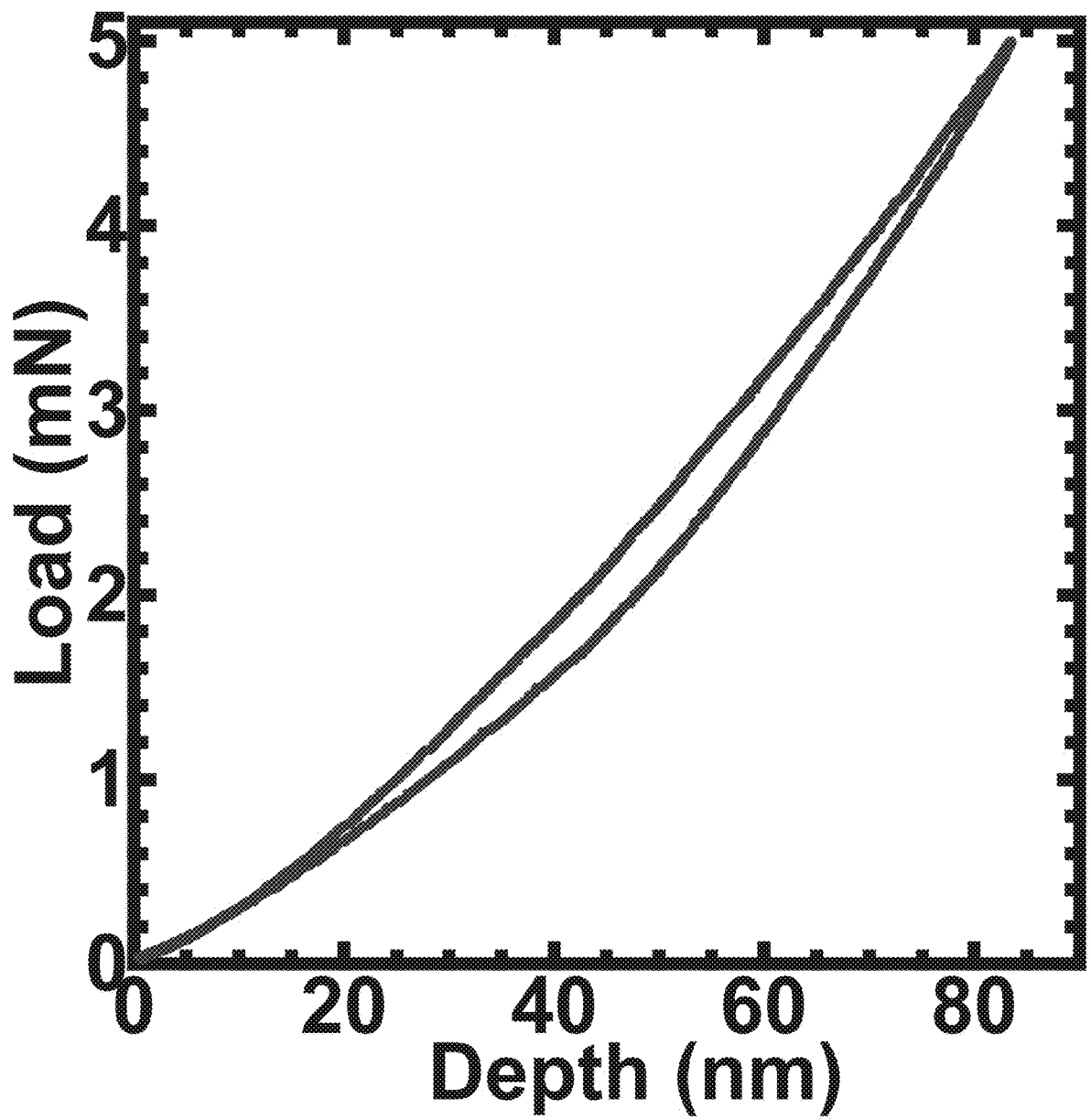
Figure 6C:
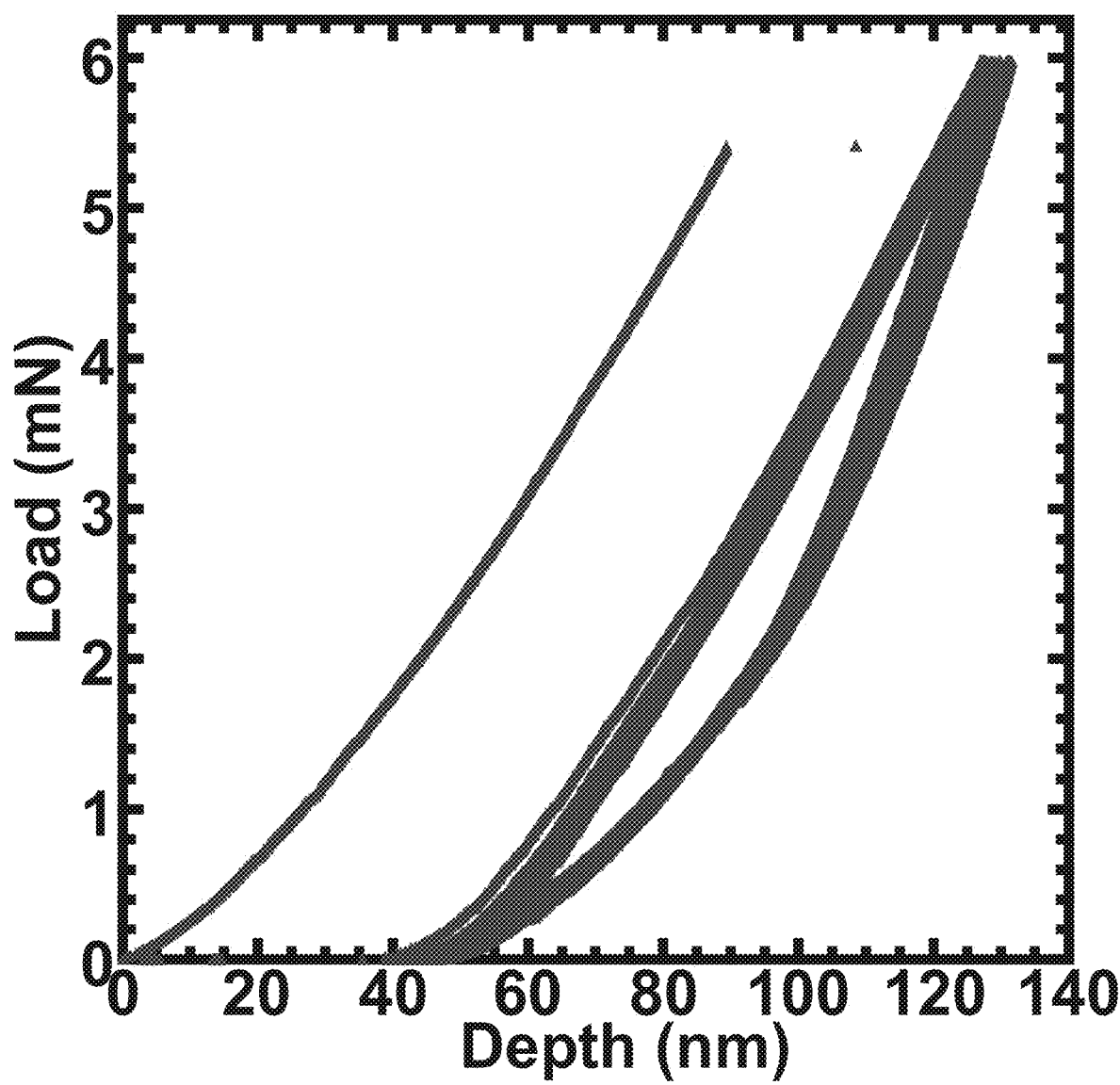
Figure 6D:
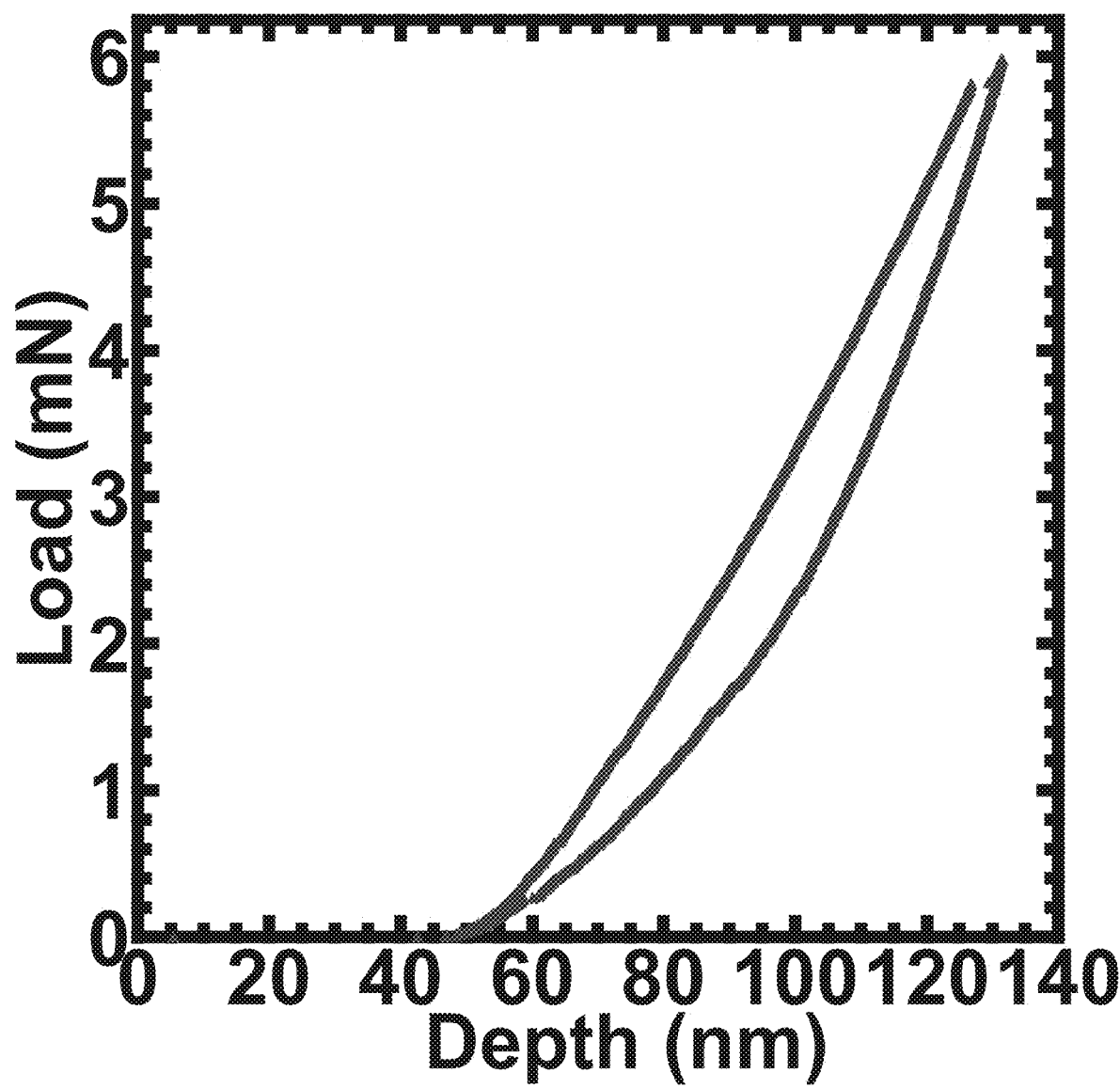
Figure 6E:
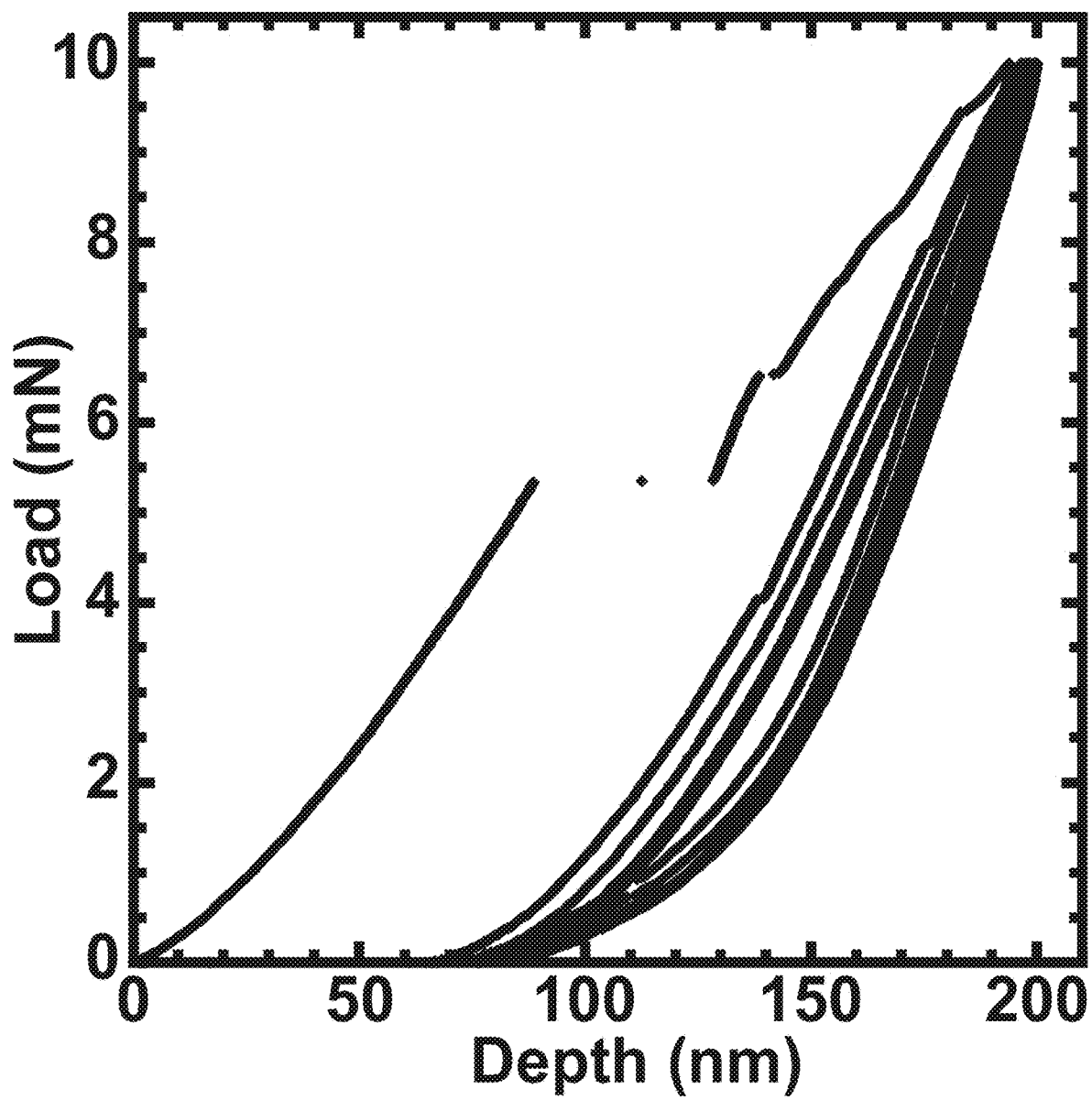
Figure 6F:
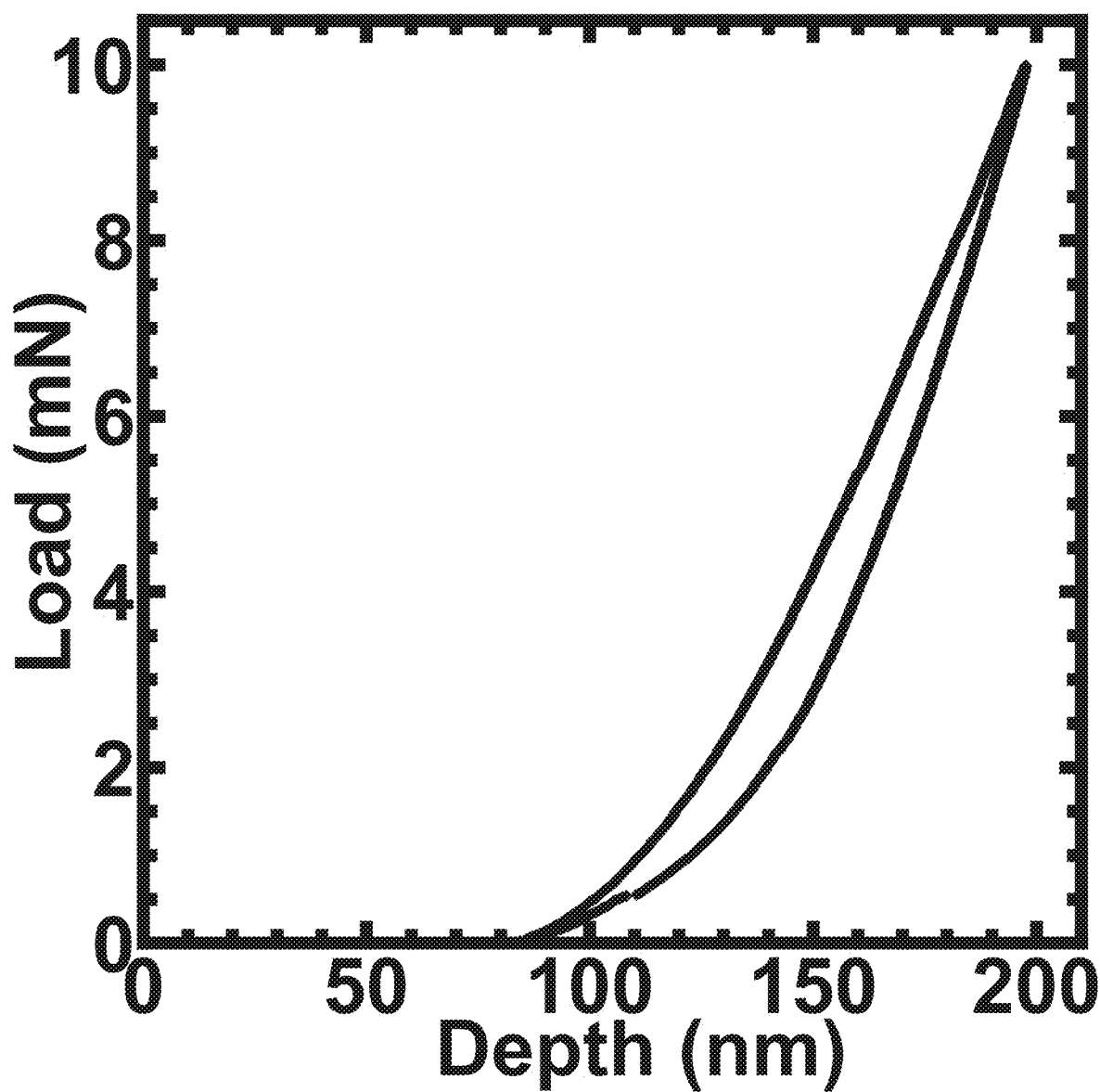

FIGS. 6A, 6C, and 6E are graphs illustrating the cyclic loading (10 cycles) behavior of the single crystal $GdPO_4$, where the peak loads are 5 mN, 6 mN, and 10 mN. FIGS. 6B, 6D, and 6F are graphs illustrating the loading behavior of the single crystal $GdPO_4$ during the tenth loading cycle of FIGS. 6A, 6C, and 6E, respectively.

Figure 7:
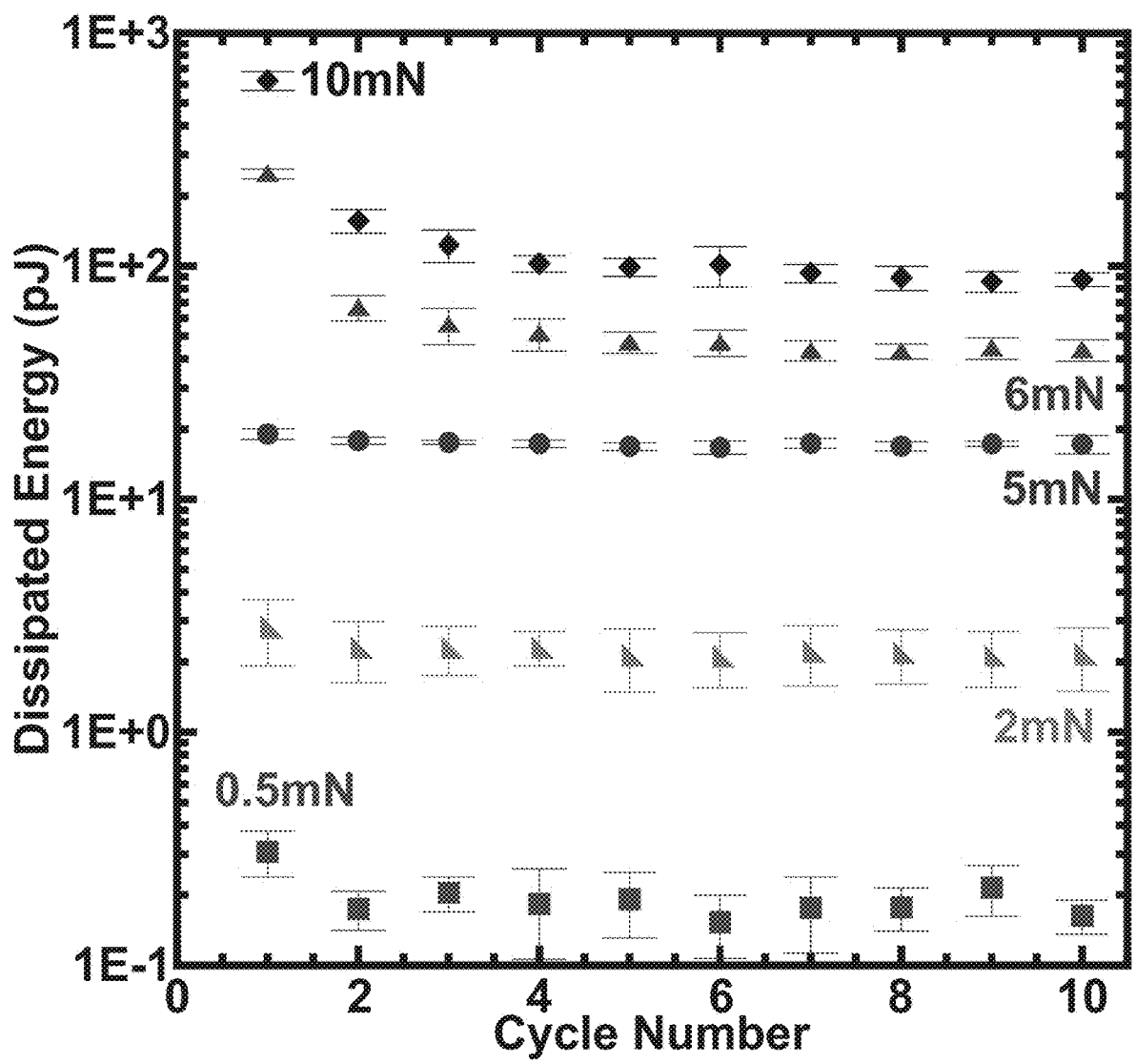

FIG. 7 is a graph illustrating the dissipated energy of the single crystal $GdPO_4$ vs. cycle number at peak loads of 0.5 mN, 2 mN, 5 mN, 6 mN, and 10 mN.

Figure 8A:
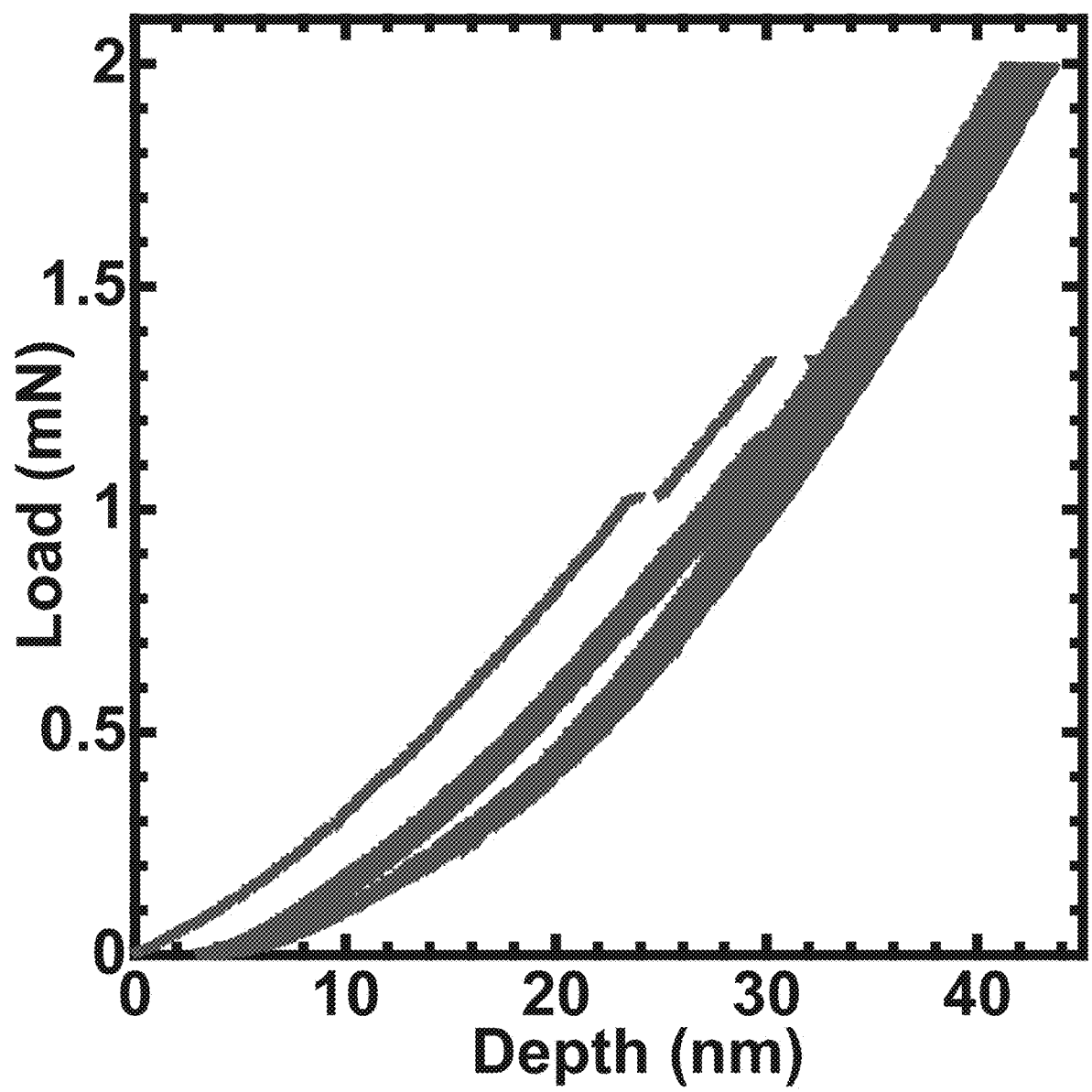
Figure 8B:
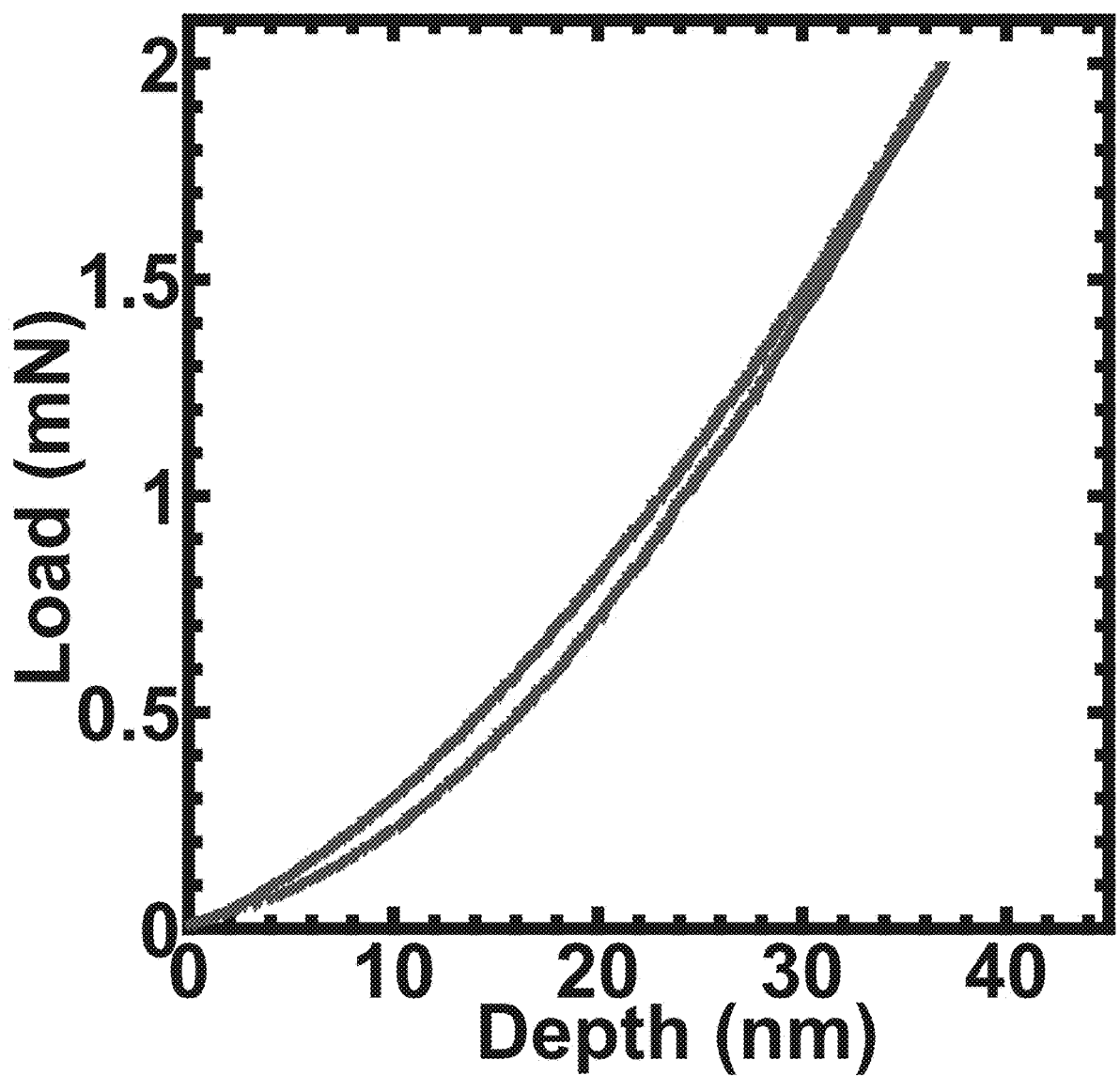
Figure 8C:
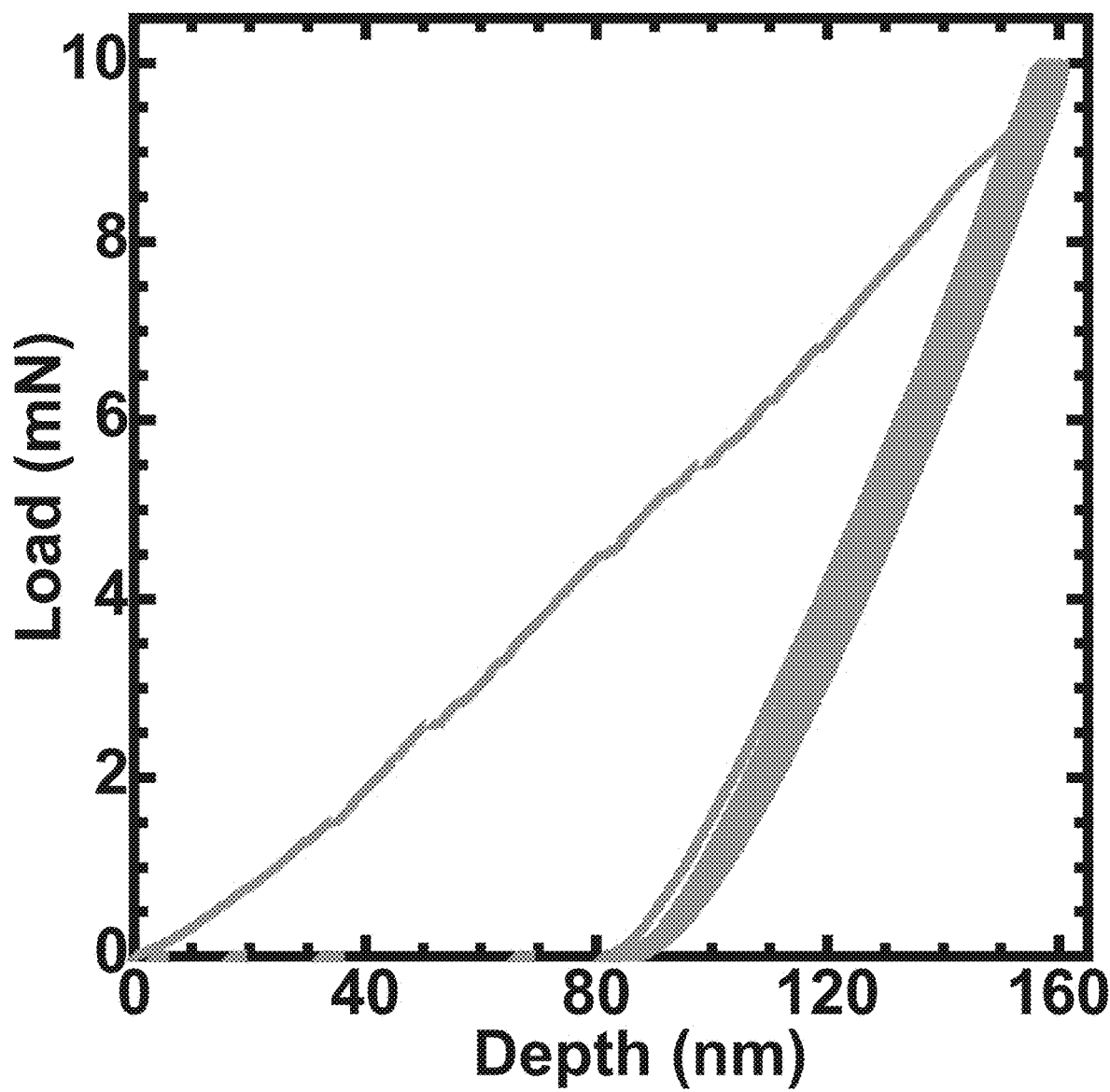
Figure 8D:
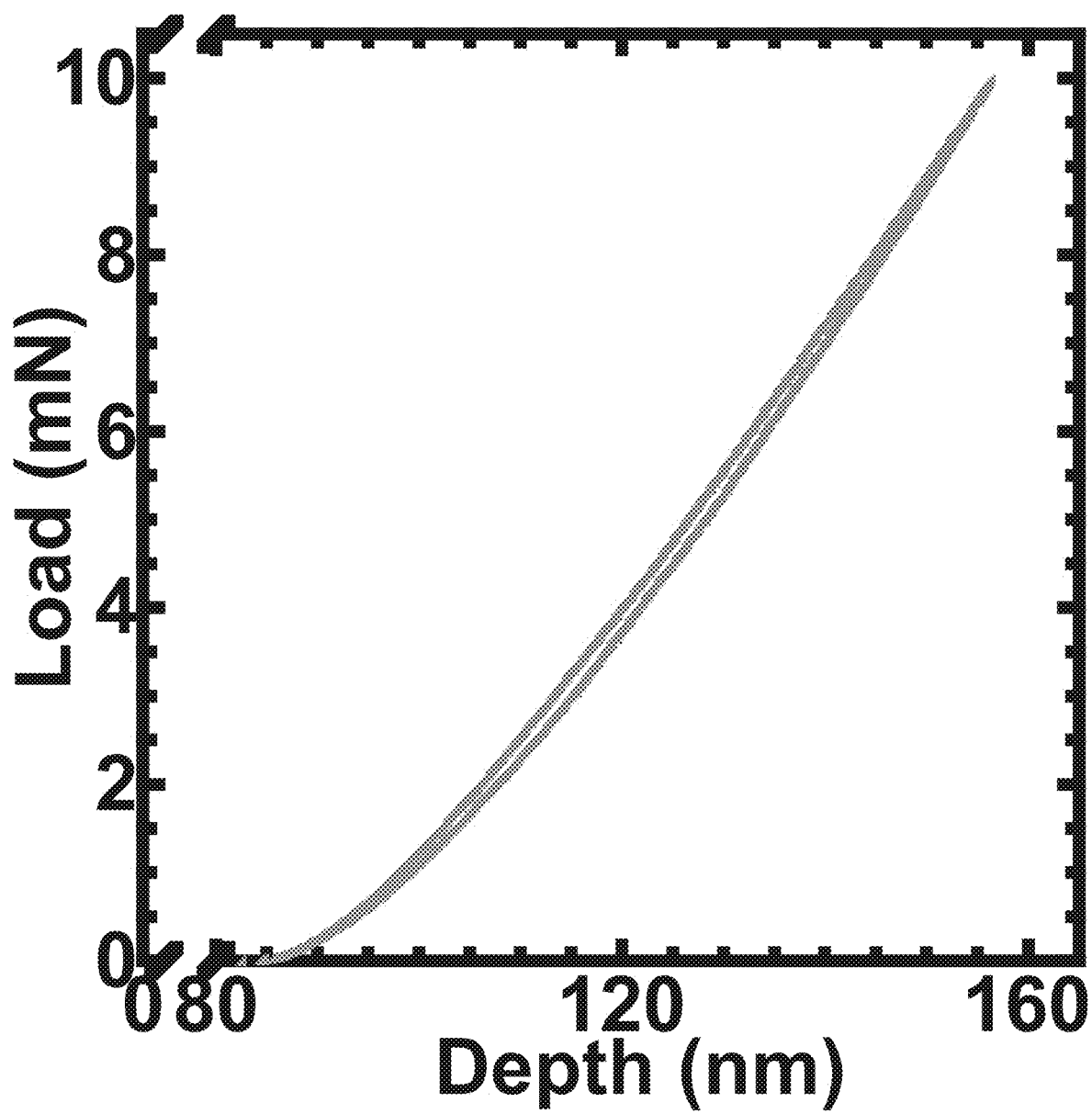

FIGS. 8A and 8C are graphs illustrating the cyclic loading (10 cycles) behavior of the polycrystalline $GdPO_4$, wherein the peak loads are 2 and 10 mN tests. The FIGS. 8B and 8D are graphs illustrating the loading behavior of the polycrystalline $GdPO_4$ during the tenth cyclic load of FIGS. 8A and 8C, respectively.

Figure 9:
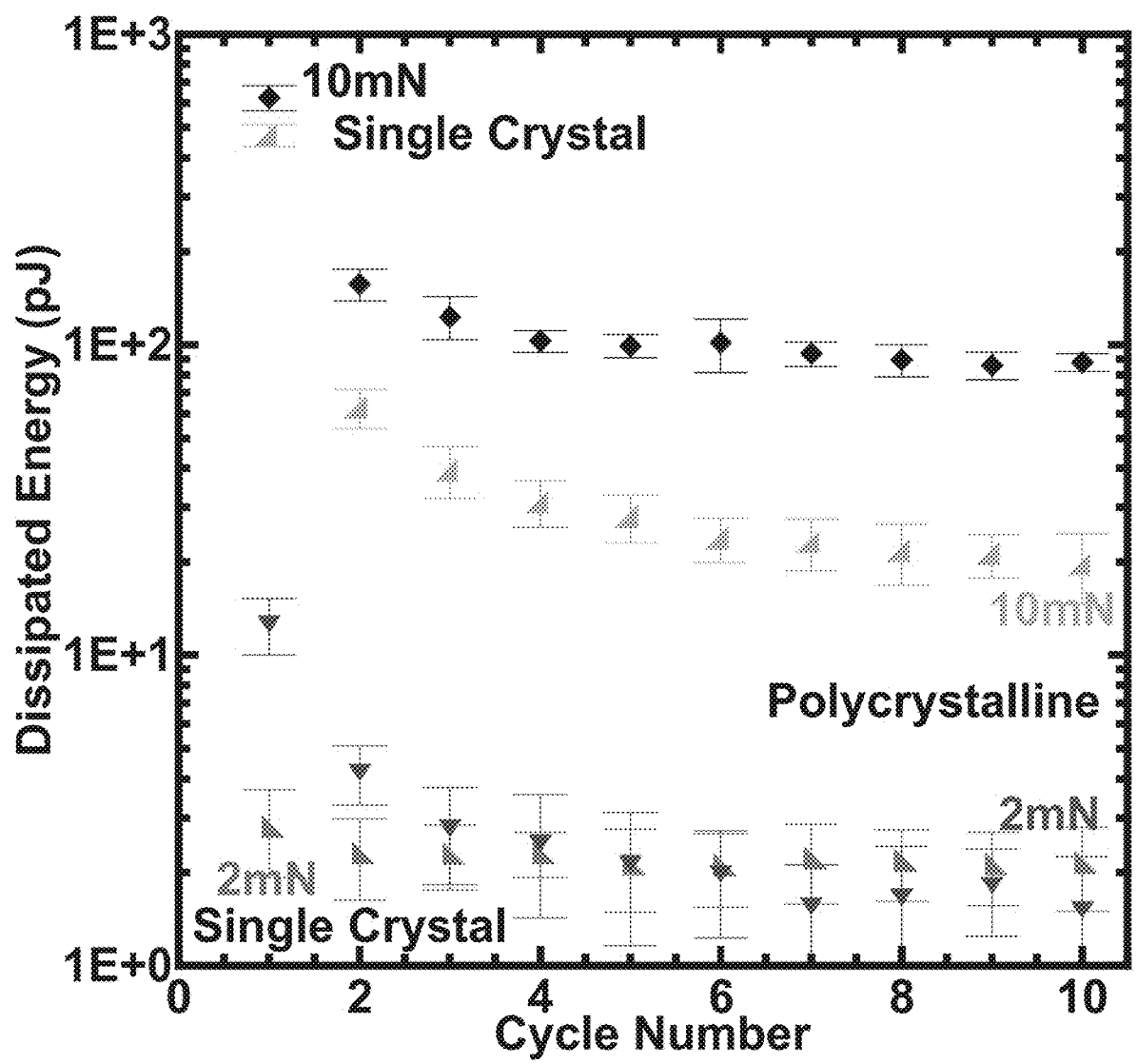

FIG. 9 is a graph comparing dissipated energies between the single crystal and polycrystalline GdPO$_4$ specimens as a function of cycles.

The drawings illustrate several embodiments of the present disclosure, wherein identical reference numerals refer to identical or similar elements or features in different views or embodiments shown in the drawings.

DETAILED DESCRIPTION

This disclosure is drawn to methods, systems, products, devices, apparatuses, and/or applications generally related to or including ferroelastic ceramic compositions. An example ferroelastic ceramic composition includes at least one compound having a relative chemical formula of $A_XB_YC_{(1-X-Y)}D$. Element A, element B, and element C are independently selected from different members of the group consisting of yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu). Element D is selected from the group consisting of a phosphate, a niobate, and a tungstate. X and Y are each equal to or greater than zero and less than one. X and Y are collective less than one. In an embodiment, the near complete solid solubility of the disclosed ferroelastic ceramic compositions allows the ferroelastic ceramic compositions disclosed herein to include a mixture of two or more different compositions of the ferroelastic ceramic compositions.

In an embodiment, the disclosed ferroelastic ceramic compositions can absorb and release energy. For example, the ferroelastic ceramic compositions can exhibit damping behavior through the act of twinning upon application of mechanical stress as well as detwinning upon removal of stress, resulting in the movement of twin boundaries. The movement of twin boundaries may help to absorbs energy to create damping, which is observable through closed hysteresis loops on loading and unloading in mechanical cycling.

The behavior of absorbing and releasing energy in the ferroelastic ceramic compositions can be demonstrated through at least the use of cyclic nanoindentation experiments that includes cyclically compressing and decompressing the ferroelastic ceramic compositions in a local region thereof. For example, a cyclic nanoindentation experiment was performed on a single-crystal GdPO$_4$ that exhibited work and depth recovery ratios similar to that of superelastic NiTi, a shape memory alloy (SMA). During load cycling in GdPO$_4$, an extremely high dissipated energy of ~250 MJ/m$^3$ was observed to be recoverable and repeatable over ten cycles and, in some embodiments, may demonstrate no exhaustion through 50 cycles, or more. This level of dissipated energy significantly exceeds that produced by existing SMAs.

Ferroelastic ceramic compositions that exhibit high dissipated energy includes at least single crystal and polycrystalline GdPO$_4$, EuPO$_4$, and TbPO$_4$. In some embodiments, the amount of dissipated energy may be higher in single crystal ferroelastic ceramic compositions than in polycrystalline ferroelastic ceramic compositions. Without wishing to be limited by theory, it is believed the different in the dissipated energy between single crystals and polycrystalline ferroelastic ceramic compositions may be, at least in part, due to the absence of constraining boundaries in the single crystal ferroelastic ceramic compositions. This trend mirrors that of conventional Shape Memory Ceramics (SMCs), where single crystal and oligocrystalline (few crystal) SMCs have higher degrees of recovery than polycrystalline SMCs. In some cases, packed powder beds of single or oliogocrystalline particles present an alternate form factor.

Conventional SMAs and SMCs, which rely on a phase transformation, exhibit damping over small temperature ranges that are specific to the material composition. Meanwhile, ferroelastic ceramic compositions may exhibit damping behavior at temperatures that range from room temperature up to 800° C. Above 800° C., the damping behavior may persist in the ferroelastic ceramic compositions until the ferroelastic ceramic compositions thermally decompose (e.g., ferroelastic ceramic compositions typically decompose at temperatures higher than 1500° C.). The ability of the ferroelastic ceramic compositions to damp in temperatures in the range of 400-1200° C. may allow for their use in engine and turbine applications where the temperatures and environment are very extreme. The ferroelastic ceramic compositions' innate corrosion resistance, even in these extreme environments, makes them additionally attractive as thermal barrier coatings for engine & turbine applications.

The disclosed ferroelastic ceramic compositions may exist in three crystallographic phases: monazite, xenotime, and anhydrite. In compositions capable of pressure-induced phase transformation, the shape memory effect may also be operative, but may operate at hydrostatic pressures in excess of 9 GPa and may be partially recoverable in some embodiments.

I. Chemistry

The ferroelastic ceramic composition disclosed herein includes (e.g., consists of, consists essentially only of) at least one compound having a chemical formula of RD. Element R is at least one lanthanide. For example, element R can include at least one of a rare earth element such as yttrium, lanthanum, cerium, praseodymium, neodymium, promethium, samarium, europium, gadolinium, terbium, dysprosium, holmium, erbium, thulium, ytterbium, or lutetium. Element D can be a phosphate (PO$_4$) since ferroelastic ceramic compositions that include at least one lanthanide bonded to a phosphate undergoes pressure-induced phase transformation and exhibit structures that support the formation of twins upon application of a load (e.g., the load causes a region of the crystalline structure of the ferroelastic ceramic composition to undergo a shape deformation such that the resulting crystal structure of the region is identical to but oriented differently from the original crystal structure). However, element D can include a niobate (NbO$_3$) or a tungstate (WO$_4$) since ferroelastic ceramic compositions that include at least one lanthanide bonded to a niobate or a tungstate also undergoes pressure-induced phase transformation and exhibit structures that support the formation of twins. In many embodiments, the rare-earth niobates and the rare-earth tungstates are similar in their abilities to undergo pressure-induced phase transformation and their structures support the formation of twins, thus the present disclosure spans those material sets, with their corresponding mixtures of rare earth elements as discussed above.

As previously discussed, element R can include at least one lanthanide. In an embodiment, element R can include at least one of an element A, an element B, or an element C where each of the elements A, B, and C are different lanthanides. In such an embodiment, the compound can exhibit the chemical formula $A_{(1-X-Y)}B_XC_YD$. The compound includes substantially equal molar amounts of the elements R and D. Thus, the molar amount of elements A, B, and C are collectively substantially equal to the molar amount of element D. As such, X and Y are equal to or greater than zero, less than one, and are collectively less than one. For example, X and/or Y can be zero, greater than zero to about 0.2, about 0.1 to about 0.3, about 0.2 to about 0.4, about 0.3 to about 0.5, about 0.4 to about 0.6, about 0.5 to about 0.7, about 0.6 to about 0.8, about 0.7 to about 0.9, or about 0.8 to about 0.99. In an embodiment, X and Y are both zero. In such an embodiment, the compound can exhibit the chemical formula AD. In an embodiment, X is greater than zero and less than one while Y is zero. In such an embodiment, the compound can exhibit the relative chemical formula $A_{(1-X)}B_XD$. In an embodiment, X and Y are both greater than zero, less than one, and collectively less than one. In such an embodiment, the compound can exhibit the relative chemical formula $A_{(1-X-Y)}B_XC_YD$. In an example, X and Y are the same or different.

It is noted that element R can include one or more additional elements in addition to elements A, B, and C. For example, element R can include an element E, an element F, an element G, etc. However, regardless of the number of elements that form element R, the atomic amount of element R is substantially equal to the atomic amount of element D.

The compounds of the ferroelastic ceramic compositions disclosed herein can exist in three crystallographic phases: monazite, xenotime, and anhydrite. For example, monazite-structured compounds of the ferroelastic ceramic compositions, such as $GdPO_4$, can exhibit the twinning mechanism of energy storage. The monazite-structure compounds of the ferroelastic ceramic compositions can exhibit the mechanism of energy storage because applying a load to the ferroelastic ceramic compositions can cause a shape change to occur in the crystal structure of the ferroelastic ceramic compositions. Changing the shape of the crystal structure of the ferroelastic ceramic compositions can cause the ferroelastic ceramic composition to store energy. Removing the load from the ferroelastic ceramic composition can cause the crystal structure to at least partially revert to the original shape thereof thereby releasing the stored energy. Xenotime-structured compounds of the ferroelastic ceramic composition, such as $TbPO_4$, can also exhibit similar mechanical behaviors as the monazite-structured compounds of the ferroelastic ceramic compositions. At least some monazite, xenotime, and anhydrite structured compounds of the ferroelastic ceramic composition may also undergo pressure-induced phase transformations. A ferroelastic ceramic composition capable of pressure-induced phase transformation may also exhibit a shape memory effect. However, in some examples, the shape memory effect of the ferroelastic ceramic composition may operate at hydrostatic pressures in excess of about 9 GPa and/or may not be fully recoverable depending on composition.

II. Characteristics

The ferroelastic ceramic composition disclosed herein can absorb energy, release energy, and/or exhibit damping behavior through the act of twinning upon application of mechanical stress and detwinning upon removal of stress, resulting in the movement of twin boundaries. In an embodiment, the movement of twin boundaries can absorb energy to create damping which may be observable through closed hysteresis loops on loading and unloading in mechanical cycling. For example, the ferroelastic ceramic composition may be cyclically compressed and decompressed in a local region, such as cyclically compressed and decompressed using any suitable technique, such as a nanoindentation technique.

In an embodiment, the ferroelastic ceramic composition disclosed herein can exhibit a single crystal structure. The single crystal ferroelastic ceramic composition (e.g., single crystal $GdPO_4$) can exhibit work and depth recovery ratios similar to, and/or better than that of superelastic NiTi. For example, during load cycling, the single crystal ferroelastic ceramic composition can exhibit an extremely high dissipated energy that is greater than about 2 $MJ/m^3$, greater than about 50 $MJ/m^3$, greater than about 100 $MJ/m^3$, greater than about 150 $Mi/m^3$, greater than about 200 $MJ/m^3$, or in ranges of about 2 $MJ/m^3$ to about 10 $MJ/m^3$, about 5 $MJ/m^3$ to about 50 $MJ/m^3$, about 10 $MJ/m^3$ to about 100 $MJ/m^3$, about 50 $MJ/m^3$ to about 300 $MJ/m^3$, about 100 $MJ/m^3$ to about 500 $MJ/m^3$, or about 300 $MJ/m^3$ to about 1000 $MJ/m^3$. The above dissipated energy of the single crystal ferroelastic ceramic composition can exceed that produced by SMAs. Additionally, during load cycling, the high dissipated energy of the single crystal ferroelastic ceramic composition can be recoverable and repeated over multiple cycles (e.g., without losing more than 50% of the dissipated energy, without losing more than 25% of the dissipated energy, or without losing more than 10% of the dissipated energy), such as over at least 5 cycles, at least 10 cycles, at least 20 cycles, at least 30 cycles, at least 40 cycles, at least 50 cycles, or in ranges of about 5 cycles to about 20 cycles, about 10 cycles to about 30 cycles, about 20 cycles to about 40 cycles, or about 30 cycles to about 50 cycles. In some examples, during load cycling, the extremely high dissipated energy of the single crystal ferroelastic ceramic composition can show substantially no exhaustion after any of the above cycles. In an embodiment, the ferroelastic ceramic compositions disclosed herein can exhibit oligocrystalline structures. In such an embodiment, the oligocrystalline ferroelastic ceramic compositions can exhibit characteristics that are substantially similar to the single crystal ferroelastic ceramic compositions.

In an embodiment, the ferroelastic ceramic compositions disclosed herein can exhibit a polycrystalline structure. Polycrystalline ferroelastic ceramic compositions can exhibit work recovery ratios and depth recovery ratios (defined below) that are less than the same ferroelastic ceramic compositions that exhibits a single crystal structure. However, the work and depth recover ratios of the polycrystalline ferroelastic ceramic compositions can be comparable to some SMAs. For example, during load cycling, the polycrystalline ferroelastic ceramic compositions disclosed herein can exhibit a high dissipated energy that is greater than about 2 $MJ/m^3$, greater than about 50 $MJ/m^3$, greater than about 100 $MJ/m^3$, greater than about 150 $MJ/m^3$, or in ranges of about 2 $MJ/m^3$ to about 10 $MJ/m^3$, about 5 $MJ/m^3$ to about 50 $MJ/m^3$, about 10 $MJ/m^3$ to about 100 $MJ/m^3$, about 50 $MJ/m^3$ to about 300 $MJ/m^3$, about 100 $MJ/m^3$ to about 500 $MJ/m^3$, or about 300 $MJ/m^3$ to about 1000 $MJ/m^3$. The amount of dissipated energy is higher in single crystal than polycrystalline ferroelastic ceramic compositions owing to the absence of constraining boundaries in the single crystal. The above dissipated energy of the ferroelastic ceramic compositions may still be comparable to those produced by SMAs. Additionally, during load cycling, the high dissipated energy of the ferroelastic ceramic compositions can be recoverable and repeated over multiple cycles (e.g., without losing more than 50% of the dissipated energy, without losing more than 25% of the dissipated energy, or without losing more than 10% of the dissipated energy), such as over at least 5 cycles, at least 10 cycles, at least 20 cycles, at least 30 cycles, at least 40 cycles, at least 50 cycles, or in ranges of about 5 cycles to about 20 cycles, about 10 cycles to about 30 cycles, about 20 cycles to about 40 cycles, or about 30 cycles to about 50 cycles. In some examples, during load cycling, the extremely high dissipated energy of the polycrystalline ferroelastic ceramic compositions can show substantially no exhaustion after any of the above cycles.

Following a loading cycle, the ferroelastic ceramic compositions disclosed herein can exhibit a yield event (e.g., major pop-in). The yield event occurs when a load applied to the ferroelastic ceramic compositions is sufficient to cause plastic deformation in the ferroelastic ceramic compositions. As such, the yield event causes residual displacement associated with permanent plastic deformation for a peak load greater than the yield event. It is noted that the stress required to cause the yield event can be higher for the single crystal ferroelastic ceramic compositions than the same ferroelastic ceramic compositions that exhibit a polycrystalline structure.

In an embodiment, the ferroelastic ceramic compositions disclosed herein can exhibit the yield event when subjected to a maximum shear stress. For example, the ferroelastic ceramic compositions can exhibit the yield event when subjected to a maximum shear stress that is greater than about 4 GPa, greater than about 5 GPa, greater than about 6 GPa, greater than about 7 GPa, greater than about 8 GPa, greater than about 9 GPa, or in ranges of about 4 GPa to about 6 GPa, about 5 GPa to about 7 GPa, about 6 GPa to about 7.5 GPa, about 7 GPa to about 8 GPa, about 7.5 GPa to about 9 GPa, or about 8 GPa to about 10 GPa.

Figure 1:
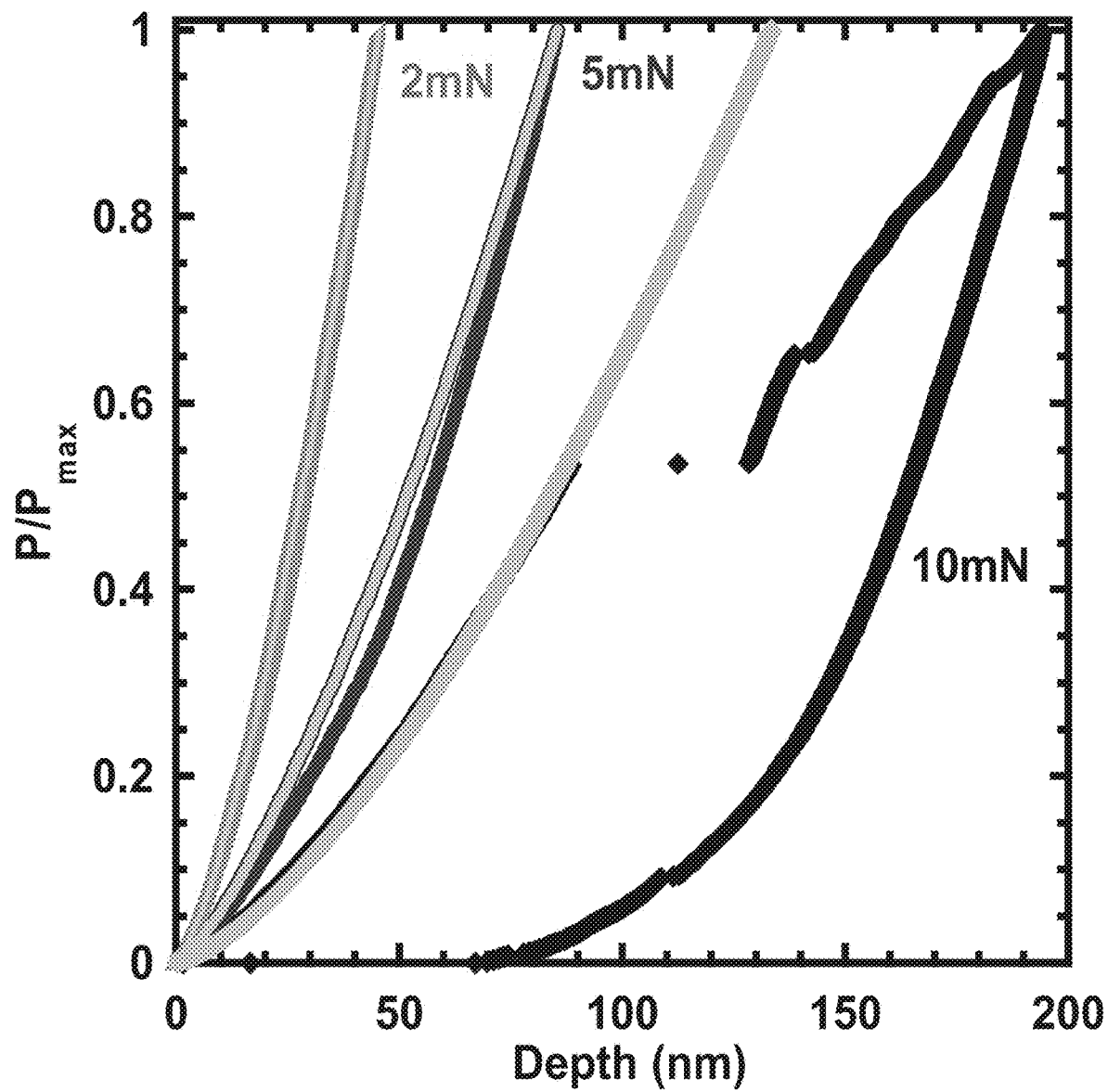
FIG. 1 is a graph illustrating the loading behavior and hysteric characteristics of the single crystal ferroelastic ceramic composition $GdPO_4$ formed according to the working example disclosed below.

In an embodiment, a loading-unloading cycle in a single crystal and/or polycrystalline ferroelastic ceramic composition, where the peak load is less and/or greater than the yield event, can be hysteric. In some embodiments, the residual displacement may be zero (i.e., if the tip of a nano-indentation device or another device applying the load was removed, there is no residual imprint), but there may be a consistent gap between loading and unloading data of several nanometers. FIG. 1 is a graph illustrating the loading behaviour and hysteric characteristics of the single crystal ferroelastic ceramic composition $GdPO_4$ formed according to the working example disclosed below. The graph shown in FIG. 1 was obtained using the nano-indentation technique disclosed in the working example at peak loads 2, 5, and 10 mN. As shown in FIG. 1, the ferroelastic ceramic compositions disclosed herein can exhibit hysteresis on cycling at all loads, though the hysteresis can be quite small for peak loads that are significantly less than the yield event. It is noted that, using the nano-indentation technique, the yield event occurs when a load greater than about 5.4 mN is applied to the ferroelastic ceramic composition. Note, the y-axis is plotted as $P/P_{max}$.

Figure 2:
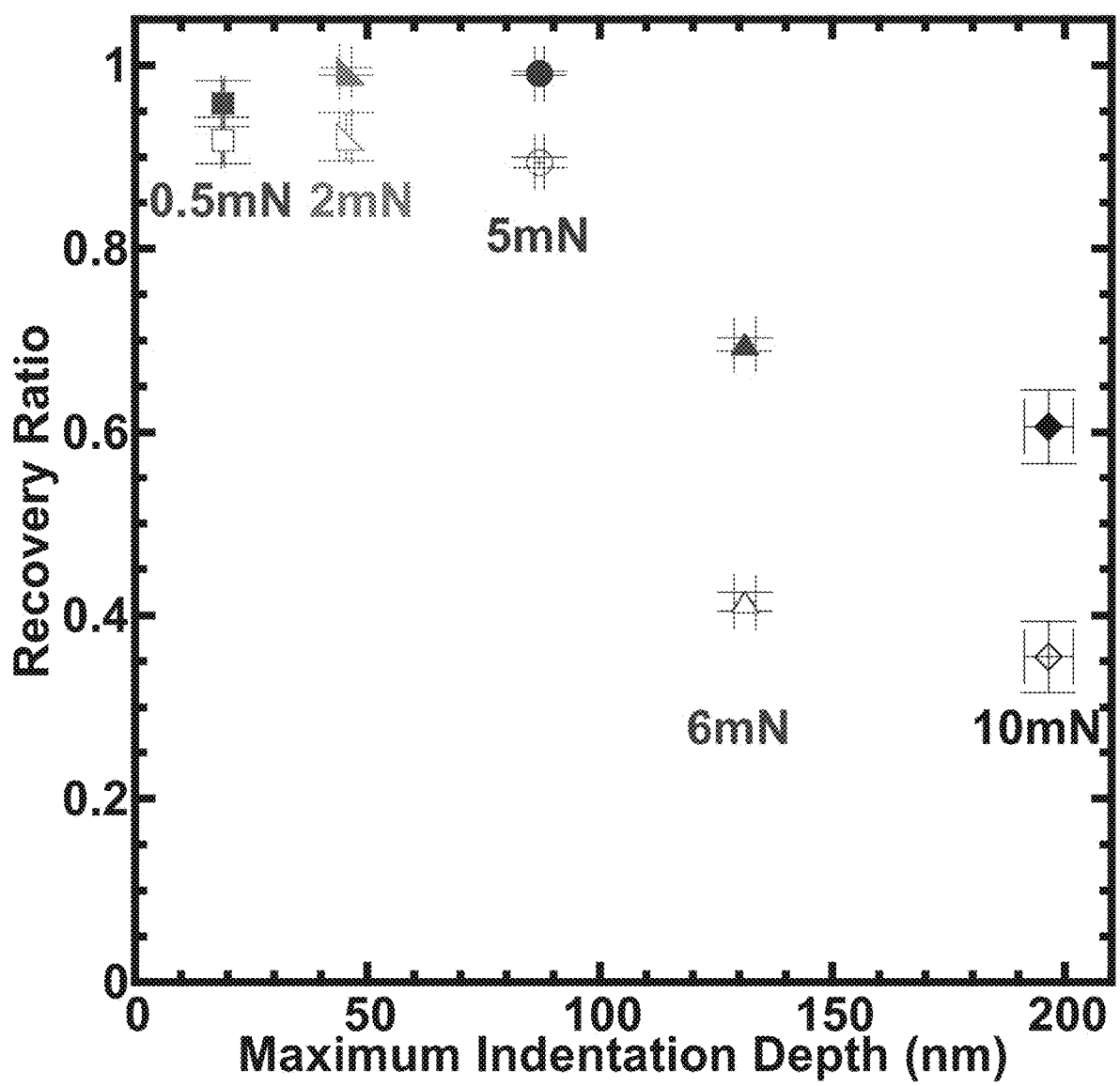
FIG. 2 is a graph illustrating the depth recovery and the work recovery ratios of single crystal $GdPO_4$ after different loads were applied thereto.

Recovery of the ferroelastic ceramic compositions can facilitate comparison between the ferroelastic ceramic compositions and SMAs. Recovery has been empirically explored in two different methods, depth recovery (Equation 1) and work recovery (Equation 2). Depth recovery is defined as:

$$\eta_h = \frac{h_{max} - h_r}{h_{max}} \quad (1)$$

where $\eta_h$ is the superelastic depth recovery, $h_{max}$ is the depth at the maximum load, and $h_r$ is the residual depth when the test is over. The ferroelastic ceramic compositions disclosed herein can exhibit a depth recovery that is greater than about 0.85 (e.g., about 0.85 to about 0.9, about 0.875 to about 0.925, about 0.9 to about 0.95, about 0.925 to about 0.975, or about 0.95 to about 1) when the load applied to the ferroelastic ceramic compositions are not sufficient to cause a yield event. For NiTi with superelastic behavior, recovery ratios can be about 0.9. When the maximum load is above the yield event, the depth recovery ratios are lower, but non-negligible, such as greater than 0.4, greater than 0.5, greater than 0.6, greater than 0.7, or greater than 0.8. Another method for determining and comparing a material's ability to recover is defined as the work recovery ratio:

$$\eta_w = \frac{\int_{h_r}^{h_{max}} Fdh}{\int_0^{h_{max}} Fdh} \quad (2)$$

where $\eta_w$ is the superelastic energy recovery (or work recovery), $h_{max}$ is the depth at the maximum load, $h_r$ is the residual depth, F is the load, and h is the displacement. Equation 2 can also represent the ratio of the area under the unloading curve to the area under the loading curve. The ferroelastic ceramic compositions disclosed herein can exhibit a work recovery ratio that is greater than about 0.8 (e.g., about 0.8 to about 0.85, about 0.825 to about 0.875, about 0.85 to about 0.9, about 0.875 to about 0.925, about 0.9 to about 0.95, about 0.925 to about 0.975, or about 0.95 to about 1) when the load applied to the ferroelastic ceramic composition is not sufficient to cause a yield event. When the maximum load is above the yield event, the depth recovery ratios are lower, but non-negligible, such as greater than 0.2, greater than 0.3, greater than 0.4, greater than 0.5, or greater than 0.6. FIG. 2 is a graph illustrating the depth recovery and the work recovery ratios of single crystal $GdPO_4$ after different loads were applied thereto. In FIG. 2, the closed symbols correspond to the depth recovery of the single crystal $GdPO_4$ and the open symbols correspond to the work recovery ratios of the single crystal $GdPO_4$. In some embodiments, as illustrated in FIG. 2, the depth recovery ratio can be greater than the work recovery ratio of the single crystal $GdPO_4$. It is noted that the data points of FIG. 2 are an average of five nano-indentations on the single crystal ferroelastic material using the nano-indentation technique disclosed below and the error bars represent standard deviation for both the recovery ratio (y-axis) and the maximum indentation depth (x-axis).

In an embodiment, a single crystal ferroelastic ceramic composition recovery was also observed—both discretely as a small pop-out (~5 nm wide) and continuously as a decrease in unloading slope. This suggests the yield event might be more accessible with the hindrance of grain boundaries, whereas, continuous slope changes are able to occur in either environment.

The ferroelastic ceramic composition disclosed herein can absorb energy, release energy, and exhibit damping behavior upon the application or removal of mechanical stress at temperatures equal to and greater than room temperature. This is contrary to most SMAs and SMCs which exhibit dampening only over small temperature ranges that are specific to the particular SMA and SMC. In an embodiment, the ferroelastic ceramic composition disclosed herein can absorb energy, release energy, and exhibit damping behavior at temperatures greater than 200° C. to a decomposition temperature thereof, such as in ranges of about 200° C. to about 400° C., about 300° C. to about 500° C., about 400° C. to about 600° C., about 500° C. to about 700° C., about 600° C. to about 800° C., about 700° C. to about 900° C., about 800° C. to about 1000° C., about 900° C. to about 1100° C., about 1000° C. to about 1200° C., about 1100° C. to about 1300° C., about 1200° C. to about 1400° C., about 1300° C. to about 1500° C., about 1400° C. to about 1600° C., or greater than 1500° C.

Figure 3A:
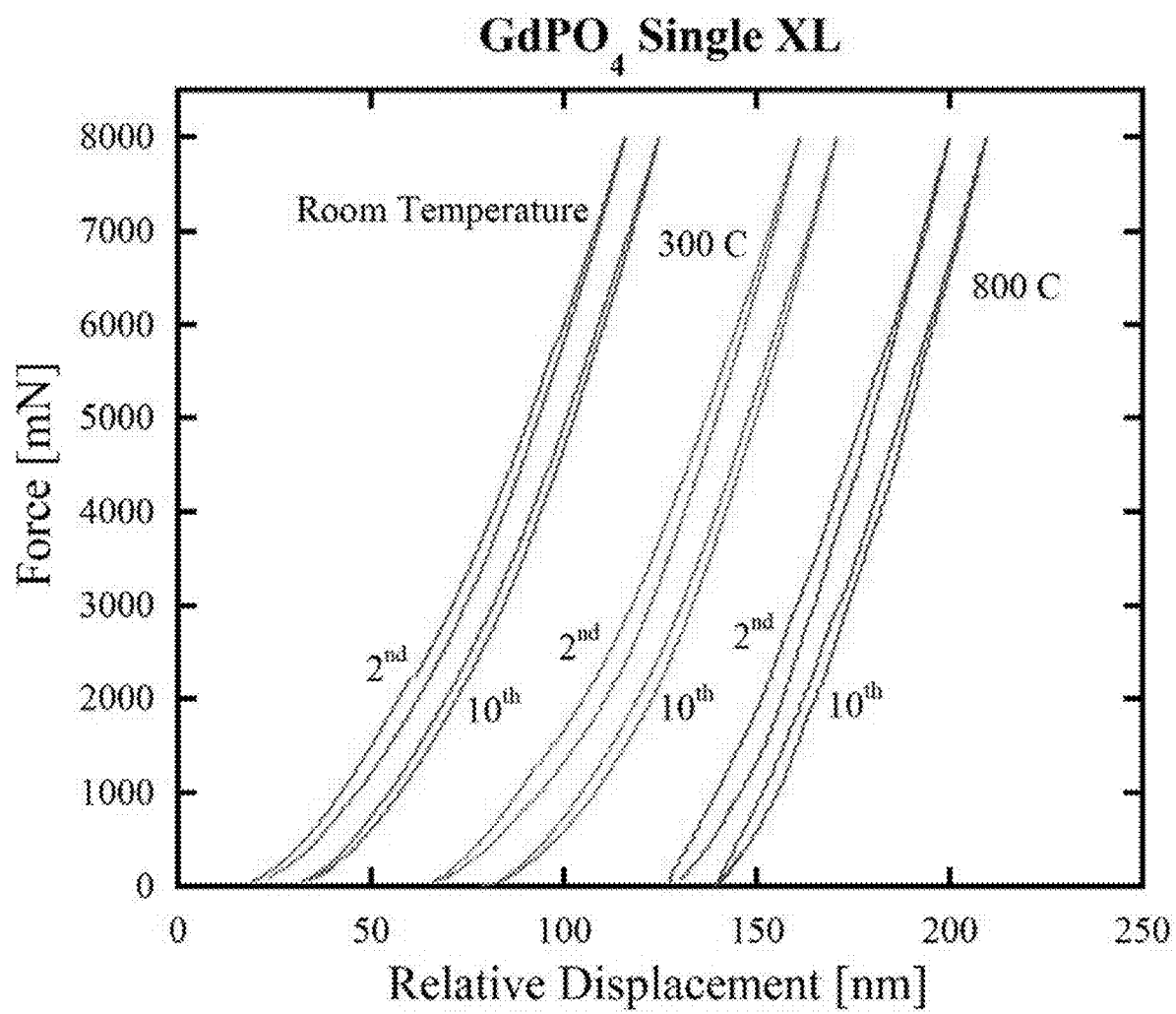
FIGS. 3A and 3B are graphs illustrating the ability of single crystal and polycrystalline $GdPO_4$, respectively, to absorb energy, release energy, and exhibiting dampening behavior at various temperatures.
Figure 3B:
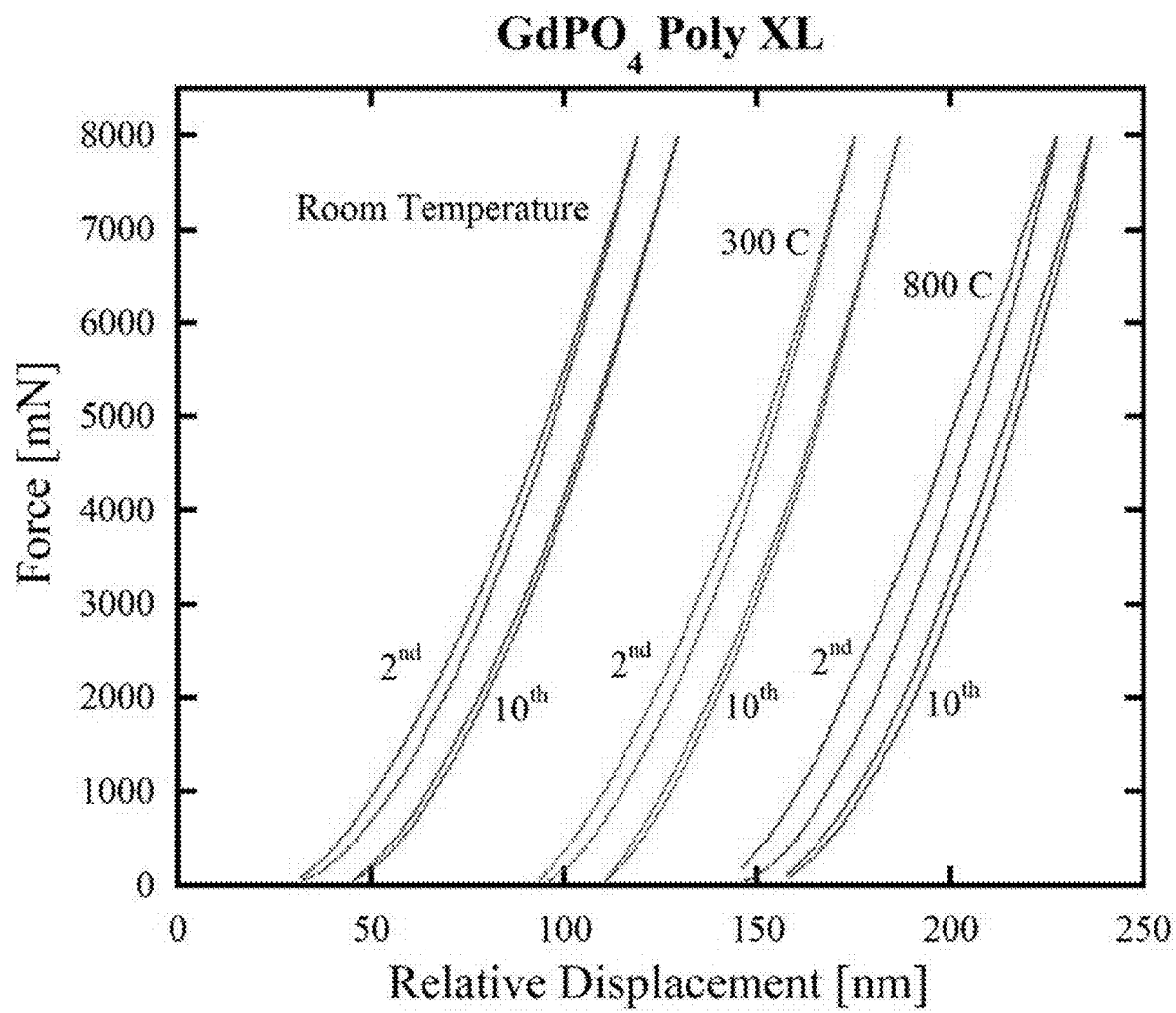

FIGS. 3A and 3B are graphs illustrating the ability of single crystal and polycrystalline $GdPO_4$, respectively, to absorb energy, release energy, and exhibiting dampening behavior at various temperatures. A single crystal $GdPO_4$ sample and a polycrystalline $GdPO_4$ sample were formed according to the methods disclosed in the working examples. A cyclic load was applied and removed from a local portion of each of the samples using a nano-indentation technique at room temperature, 300° C., and 800° C. The force applied to the local region of each of the samples vs. the displacement of the nano-indentator from the second and tenth cycle is plotted on FIGS. 3A and 3B. FIGS. 3A and 3B illustrate that both the single crystal and polycrystalline $GdPO_4$ samples exhibited damping behavior over a range of temperatures. A graph that depicts similar graphs for single crystals of $EuPO_4$ and $TbPO_4$ at room temperature is not shown.

The ferroelastic ceramic composition disclosed herein can also exhibit high oxidation resistance and/or corrosion resistance at elevated temperature. For example, the ferroelastic ceramic compositions disclosed herein can exhibit high oxidation and/or corrosion resistance at temperatures greater than room temperature, greater than about 200° C., greater than about 500° C., greater than about 800° C., or greater than about 1000° C. As will be discussed in more detail below, this allows the ferroelastic ceramic composition to be used in high temperature applications, such as applications that can heat the ferroelastic ceramic composition to temperatures of about 400° C. to about 1200° C.

III. Methods of Forming

The ferroelastic ceramic compositions disclosed herein can be formed using any suitable technique. For some embodiments, the ferroelastic ceramic compositions can be formed via precipitation by disposing a lanthanide-containing precursor in at least one of phosphoric acid, tungstic acid, niobic acid, or another suitable acid. In an embodiment, the ferroelastic ceramic compositions can be formed using a sintering technique. In an embodiment, the ferroelastic ceramic compositions can be formed using a high-temperature solution growth process using a lanthanide-containing precursor. In an embodiment, the ferroelastic ceramic compositions can be formed using a solid state chemistry technique. In an embodiment, the ferroelastic ceramic compositions can be formed using a chemical vapor deposition technique or a physical vapor deposition technique. In an embodiment, the ferroelastic ceramic compositions can be formed using any other suitable technique known to those of skill in the art. In an embodiment, the ferroelastic ceramic compositions can be formed using a combination of any of the above methods.

In a particular example, a single crystal ferroelastic ceramic composition including $GdPO_4$ can be synthesized using a high-temperature solution-growth process using $Pb_2P_2O_7$ and mounting the $GdPO_4$ to a suitable substrate. The substrate can include, for example, glass. It is noted that this method can be used to form ferroelastic ceramic composition other than $GdPO_4$.

In a particular example, a polycrystalline ferroelastic ceramic composition including $GdPO_4$ can be synthesized via direct precipitation from a gadolinium (III) nitrite precursor in phosphoric acid to form a $GdPO_4$ powder. An example method of direct precipitation of a lanthanide phosphate is disclosed in Michael T. Schatzmann et al., *Synthesis of monoclinic monazite, $LaPO_4$, by direct precipitation*, J MATER CHEM. 19 (2009), the disclosure of which in incorporated herein, in its entirety, by this reference. After forming the $GdPO_4$, the $GdPO_4$ powder was ball milled for about 24 hours in ethanol using a zirconia media, calcined at about 1200° C. for two hours, followed by a second ball-mill period for about 24-hours, and then finally sintered for two hours at about 1500° C. into a polycrystalline pellet. It is noted that this method can be used to form ferroelastic ceramic composition other than $GdPO_4$. For example, this method can be modified to include a lanthanide-containing compound other than gadolinium (III) nitride, such as europium nitride, thorium nitride, a mixture of two or more rare earth containing compounds were each of the two or more rare earth containing compounds include different lanthanides (e.g., a mixture of gadolinium nitride and europium nitride), etc. In other embodiments, this method can be modified to include tungstic acid or niobic acid instead of phosphoric acid. In some embodiments, three or more rare earth elements may be mixed.

In an embodiment, the ferroelastic ceramic composition can be subjected to one or more processes after forming the ferroelastic ceramic composition. For example, the ferroelastic ceramic composition can be polished to exhibit a selected surface roughness, such as a surface roughness (Rrms), over a tested area, of less than about 1 μm, less than about 100 nm, less than about 50 nm, less than about 10 nm, or less than about 5 nm. In many embodiments, the tested area may be about 25 μm². In an example, the ferroelastic ceramic composition can be machined to exhibit a selected shape.

IV. Methods of Using

FIG. 4A is a flow chart of an example method 400a of using any of the ferroelastic ceramic compositions disclosed herein. The method 400a includes the acts 405a and 410a. The acts 405a and 410a of the method 400a are for illustration purposes. In some embodiments, the acts may be performed in a different order, eliminated, divided into additional acts, supplemented with other acts, or combined together into fewer acts.

Act 405a of the example method 400a includes applying a load to at least a portion of a ferroelastic ceramic composition. The load applied to the ferroelastic ceramic composition can cause the ferroelastic ceramic composition to elastically or plastically deform (e.g., form an indentation, decrease in size, or otherwise deform). The load can be applied to the ferroelastic ceramic composition using any suitable method. In an example, the load can be applied to the ferroelastic ceramic composition using a nano-indentation technique, as disclosed in more detail below. In another example, the load can be applied to the ferroelastic ceramic composition by compressing, applying a shear stress, or applying a tensile stress to at least a portion of the ferroelastic ceramic composition.

Act 410a of the example method 400a includes, after applying the load, removing the load from the at least a portion of the ferroelastic ceramic composition. Removing the load from the at least a portion of the ferroelastic ceramic composition can cause the ferroelastic ceramic composition to at least partially recover the original shape thereof (e.g., at least partially return to the shape the ferroelastic ceramic composition exhibited before the load was applied thereof). For example, if the load was not sufficient to cause the yield event, removing the load from at least a portion of the ferroelastic ceramic composition can cause the ferroelastic ceramic composition to substantially return to the original shape thereof (e.g., exhibit a depth recovery depth or work recovery ratio that is greater than about 0.85, greater than about 0.9, greater than about 0.95). In an example, if the load was sufficient to cause the yield event, removing the load from at least a portion of the ferroelastic ceramic composition can cause the ferroelastic ceramic composition to be deformed (e.g., exhibit a pop-in, a slope, and/or a depth recovery or work recovery ratio that is less than 0.85).

FIG. 4B is a flow chart of an example method 400b of using any of the ferroelastic ceramic compositions disclosed herein. The method 400b includes the acts 405b, 410b, and 415b. The acts 405b, 410b, and 415b of the method 400b are for illustration purposes. In some embodiments, the acts may be performed in a different order, eliminated, divided into additional acts, supplemented with other acts, or combined together into fewer acts.

Act 405b of the example method 400b includes heating any of the ferroelastic ceramic composition disclosed to a temperature greater than about room temperature and less than a decomposition temperature of the ferroelastic ceramic composition. For example, act 405b can include heating the ferroelastic ceramic composition to a temperature that is greater than 200° C., greater than 500° C., greater than 1000° C., or in ranges of about 200° C. to about 1500° C., about 300° C. to about 1200° C., about 200° C. to about 500° C., about 400° C. to about 800° C., about 700° C. to about 1000° C., about 900° C. to about 1200° C., or about 1000° C. to about 1500° C.

Act 410b of the example method 400b includes, while the ferroelastic ceramic composition is heated, applying a load to at least a portion of a ferroelastic ceramic composition. Act 415b of the example method 400b includes, after applying the load, removing the load from the at least a portion of the ferroelastic ceramic composition. Act 415b can be performed while the ferroelastic ceramic composition is heated or can be performed after the ferroelastic ceramic composition is cooled to about room temperature. Even though the ferroelastic ceramic composition is heated during act 410b and, optionally, during act 415b, the acts 410b and 415b can be the same as or substantially similar to the acts 405a and 410a, respectively, of FIG. 4A since the ferroelastic ceramic compositions disclosed herein substantially maintain their ferroelastic behavior at temperatures that are greater than room temperature and less than the decomposition temperature thereof.

V. Applications

In an embodiment, the damping behavior of the ferroelastic ceramic compositions disclosed herein in the range of about 400° C. to about 1200° C. allows for use of the ferroelastic ceramic compositions in engine and turbine applications where the temperatures and environment are very extreme.

In an embodiment, a previously discussed, the ferroelastic ceramic compositions disclosed herein exhibit good oxidation and corrosion resistance, even at high temperatures. This allows the ferroelastic ceramic compositions disclosed herein to be used as thermal barrier coatings for engines and/or turbines. FIG. 5 is a schematic cross-sectional view of a portion of an engine or turbine 500, according to an embodiment. The engine or turbine 500 includes at least one component 502. The component 502 can include, for example, at least one of a piston crown, a valve, a cylinder cover, a cylinder wall, or a turbine blade. The component 502 can include at least one surface 504 that is configured to be exposed to elevated temperatures (e.g., a temperature greater than room temperature and less than a decomposition temperature of the ferroelastic ceramic composition, for example from about 300° C. to about 1500° C. or about 400° C. to about 1200° C.

The engine or turbine 500 can include a coating 506 that covers at least a portion of the surface 504. The coating 506 can include any of the ferroelastic ceramic compositions disclosed herein. The coating 506 can limit heat dissipation through the component 502 which can, in some embodiments, increase the efficiency of the engine or turbine 500. Additionally, the dampening behavior of the coating 506 can help protect the component 500 from damage caused by operating the engine or turbine 500 thereby increasing the life expectancy of the component 502.

The coating 506 can be applied to the component 502 using any suitable method, such as chemical vapor deposition or dip coating. The coating 506 can exhibit a thickness greater than about 100 nm, such as greater than about 500 nm, greater than about 1 greater than about 5 greater than about 10 greater than about 50 greater than about 100 or in ranges of about 100 nm to about 500 nm, about 250 nm to about 1 about 500 nm to about 2 about 1 μm to about 5 about 2 μm to about 10 about 5 μm to about 50 about 10 μm to about 100 or about 50 μm to about 500 μm.

VI. Working Examples

While the working examples disclosed herein pertain to the ferroelastic ceramic composition $GdPO_4$, it is noted that the principles, characteristics, and behaviors disclosed in the working examples also apply to the other ferroelastic ceramic compositions disclosed herein.

Indentation experiments were conducted using a single crystal and a polycrystalline specimen of monazite $GdPO_4$. The single crystal $GdPO_4$ specimen was synthesized via a high-temperature solution-growth process using $Pb_2P_2O_7$ (as described above) and mounted to a glass substrate. The crystal orientation of the indentation surface of the single crystal $GdPO_4$ was determined to have a surface normal direction of [51$\bar{3}$] using electron backscatter diffraction (EBSD) in a FEI Helios NanoLab 600i (Hillsboro, Oreg.). The polycrystalline $GdPO_4$ was prepared by direct precipitation from gadolinium (III) nitrate processed into a fully dense polycrystalline pellet, and polished. Both the single crystal and the polycrystalline $GdPO_4$ specimens had a surface roughness (Rrms) of less than about five nanometers over an area of 25 $\mu m^2$.

Nano-indentation experiments were conducted using a Hysitron TI-950 TriboIndenter (Minneapolis, Minn.) with a spherical tip, 1-dimensional transducer, and a closed loop scanner. The radius of curvature of the tip was determined to be 1.1±0.2 μm using a tungsten calibration sample and Hertzian contact mechanics. Constant loading and unloading rates were used for all nano-indentation test segments, with segment lengths held constant at 3 seconds for all tests. Cyclic loading with 10 cycles was conducted on the single crystal $GdPO_4$ using maximum loads of 0.5 mN, 2 mN, 5 mN, 6 mN, and 10 mN and on the polycrystalline GdPO$_4$ using maximum loads of 2 mN and 10 mN. Each testing condition was repeated 5 times at a spacing of 20 μm. The surface of the single crystal GdPO$_4$ specimen in the vicinity of a 10 mN indentation was scanned using a MFP-3DT atomic force microscope (AFM) (Asylum Research Inc, Santa Barbara, Calif.) to inspect for evidence of fracture.

FIGS. 6A, 6C, and 6E are graphs illustrating the cyclic loading (10 cycles) behavior of the single crystal GdPO$_4$, where the peak loads are 5 mN, 6 mN, and 10 mN. FIGS. 6B, 6D, and 6F are graphs illustrating the loading behavior of the single crystal GdPO$_4$ during the tenth loading cycle of FIGS. 6A, 6C, and 6E, respectively. Hysteresis on cycling of the single crystal GdPO$_4$ was observed for all loads, even though it was quite small for peak loads 0.5 mN and 2 mN. This behavior of the single crystal GdPO$_4$ may be seen clearly in load-depth plots with all of the cycles shown. Repetitive loops of the single crystal GdPO$_4$, which fall on top of one another, are shown in FIG. 6A with the peak load of 5 mN. FIG. 6B shows data collected from the single crystal GdPO$_4$ at a peak load of 6 mN; the load-depth curve showed plastic deformation (i.e., yield event) via the yield event at about 5.4 mN followed by repetitive looping. At the maximum peak load of 10 mN (FIG. 6C), more plastic deformation of the single crystal GdPO$_4$ is shown followed by shirking repetitive loops as the cycling continued. It is noted that the other ferroelastic ceramic compositions disclosed herein would exhibit similar hysteresis behavior on cycling and similar plastic deformation when loaded above the yield event.

FIG. 7 is a graph illustrating the dissipated energy of the single crystal GdPO$_4$ vs. cycle number at peak loads of 0.5 mN, 2 mN, 5 mN, 6 mN, and 10 mN. Calculations of dissipated energy of the single crystal GdPO$_4$ during nanoindentation ranged from a few to thousands of picojoules ("pJ") and increased with increasing the maximum load. Dissipated energy is stable over time with respect to increasing number of cycles for a peak load that was less than the yield event. The 6 mN and 10 mN peak loads applied to the single crystal GdPO$_4$ (e.g., load above the yield event) exhibited a decay in dissipated energy with continued cycling, with the largest drop observed between the 1$^{st}$ and 2$^{nd}$ cycle. This drop was attributed to the plastic deformation in the single crystal GdPO$_4$ associated with the 1$^{st}$ cycle. The 2$^{nd}$ cycle on the single crystal GdPO$_4$ had recoverable dissipated energy, however, a small decay was observed as cycling continued. The 5 mN peak load indentations retained 2 pJ of dissipated energy even in the 50$^{th}$ cycle, indicating that the cycling behavior is quite stable. It is noted that the other ferroelastic ceramic compositions disclosed herein would exhibit similar trends.

Within the SMAs literature, the dissipated energy of NiTi is typically ranged from 10-20 MJ/m$^3$ whereas the dissipated energy of SMCs (e.g., ZrO$_2$ pillars) can approach 100 MJ/m$^3$ and the dissipated energy of the compression of microspheres of ZrO$_2$ can be 20-40 MJ/m$^3$. In spherical indentation, the stress field is concentrated within a hemispherical radius of ~3a, where a is the Hertzian contact radius. Using a hemispherical volume with radius 3a, the dissipated energy per unit volume of the single crystal GdPO$_4$ was calculated to be about 250 MJ/m$^3$ for the 6 mN tests. As such, the dissipated energy of the single crystal GdPO$_4$ is higher than the values reported for ZrO$_2$ microhemisphere compressions. However, if you take into account a stressed volume of radius=3a, which is substantially smaller than the total volume of the ZrO$_2$ particles, the dissipated energy of the ZrO$_2$ particles per unit volume may be comparable to the values computed for the single crystal GdPO$_4$ samples, and both substantially exceed that of metallic SMAs. It is noted that the other ferroelastic ceramic compositions disclosed herein exhibit similar dissipated energies that are greater than or comparable to other SMAs and SMCs.

The storage and recovery of mechanical energy of the single crystal GdPO$_4$ occurs at very high stresses, repeatedly, and without fracture. Topographic maps of the indentation site of the single crystal GdPO$_4$, collected using AFM, determined that no surface fracture had occurred on the single crystal GdPO$_4$ even at the highest peak loads. However, there was a large amount of expelled material surrounding the indentation site of the single crystal GdPO$_4$. It was determined that the maximum shear stress, $\tau_{max}$, associated with the yield event was 7.4±1.1 GPa using Equation 3:

$$\tau = 0.465\left(\frac{4E^*}{3\pi}\right)\left(\frac{h}{R}\right)^{\frac{1}{2}} \quad (3)$$

where τ is the maximum shear stress, E* is the reduced modulus, h is the indentation depth, and R is the tip radius. The single crystal GdPO$_4$ was sustaining shear stresses comparable to the theoretical shear yield stress of the single crystal GdPO$_4$ (e.g., about 5.9 GPa±1.0 GPa) without fracturing and able to do it repeatedly. Isotropic assumptions as a first approximation to the stress values are used here to determine the maximum shear stress and the theoretical shear yield stress of the single crystal GdPO$_4$ due to the fact that the full stress states of the single crystal GdPO$_4$ are not know and have not been predicted. FIG. 1 shows that the material follows Hertzian predictions before the major yield event and therefore Equation 3 is a decent approximation. As previously discussed, the other ferroelastic ceramic compositions disclosed herein exhibit similar maximum shear stresses.

The single crystal GdPO$_4$ is not influenced and/or affected by grain boundaries, which could have affected the ability of the single crystal GdPO$_4$ to twin and detwin during cyclic loading. The polycrystalline GdPO$_4$ specimen was tested at loads below the yield event seen in single crystal GdPO$_4$ (e.g., at a load of about 2 mN) as well as loads above the yield event seen in the single crystal GdPO$_4$ (e.g., at a load of about 10 mN). FIGS. 8A and 8C are graphs illustrating the cyclic loading (10 cycles) behavior of the polycrystalline GdPO$_4$, wherein the peak loads are 2 and 10 mN tests. The FIGS. 8B and 8D are graphs illustrating the loading behavior of the polycrystalline GdPO$_4$ during the tenth cyclic load of FIGS. 8A and 8C. Even at the low loads, the polycrystalline specimen showed plastic deformation. It is noted that the other polycrystalline ferroelastic ceramic compositions disclosed herein exhibit similar cyclic loading behaviors.

FIG. 9 is a graph comparing dissipated energies between the single crystal and polycrystalline GdPO$_4$ specimens as a function of cycles. As shown in FIG. 9, it was found that the polycrystalline GdPO$_4$ had decreased amounts of dissipated energy compared to the single crystal GdPO$_4$. There was also an increased decay in the energy with increasing cycles of the polycrystalline materials, most likely due to grain boundaries. This behavior is analogous to how the oligocrystalline and polycrystalline particles of ZrO$_2$ show decreased recovery and cycling when compared to single crystal specimens. For ceramics, due to their brittle nature, the accommodation of differential strains at the various boundaries are not handled well and often times wind up limiting the behavior of a given material system. It is noted that the other ferroelastic ceramic compositions disclosed herein exhibit similar cyclic loading behavior.

In summary, a series of indentation tests were completed on ferroelastic single and polycrystalline $GdPO_4$ to characterize the occurrence of cyclic behaviour. These materials, specifically in single crystal form, were found to behave comparable to that of NiTi using empirical recovery ratio calculations, and in some cases surpass the 0.9 recovery ratios of the SMA. Furthermore, single crystal $GdPO_4$ was found to have a dissipated energy of 250 $MJ/m^3$, a value similar to other superelastic ceramics such as $ZrO_2$ particles and a value that surpasses that of NiTi. The ability for the material to cycle, as well as the amount of recoverable energy, opens the doors for exciting new applications for $GdPO_4$.

We claim:

1. A ferroelastic ceramic composition comprising:
    at least one compound having a relative chemical formula of $A_{(1-X-Y)}B_XC_YD$ wherein:
        an element A, an element B, and an element C are independently selected from different members of the group consisting of yttrium, lanthanum, cerium, praseodymium, neodymium, promethium, samarium, europium, gadolinium, terbium, dysprosium, holmium, erbium, thulium, ytterbium, and lutetium;
        an element D is selected from the group consisting of a phosphate, a niobate, and a tungstate, wherein the phosphate is $PO_4$, the niobate is $NbO_3$, and the tungstate is $WO_4$;
        X is equal to or greater than zero and less than one; and
        Y is equal to or greater than zero and less than one;
        wherein X and Y are collectively less than one;
        wherein the ferroelastic ceramic composition is a single crystal.
2. The ferroelastic ceramic composition of claim 1, wherein the element D is the phosphate.
3. The ferroelastic ceramic composition of claim 1, wherein the element D is a niobate or a tungstate.
4. The ferroelastic ceramic composition of claim 1, wherein X is zero.
5. The ferroelastic ceramic composition of claim 4, wherein Y is zero.
6. The ferroelastic ceramic composition of claim 1, wherein the ferroelastic ceramic composition exhibits a dissipated energy that is greater than about 50 $MJ/m^3$.
7. The ferroelastic ceramic composition of claim 6, wherein the ferroelastic ceramic composition is recoverable and repeatable over at least 5 cycles without losing more than 50% of the dissipated energy.
8. The ferroelastic ceramic composition of claim 1, wherein the ferroelastic ceramic composition exhibits a maximum shear stress that is greater than about 4 GPa.
9. The ferroelastic ceramic composition of claim 1, wherein the ferroelastic ceramic composition exhibiting a depth of recovery that is greater than about 0.85.
10. The ferroelastic ceramic composition of claim 1, wherein the ferroelastic ceramic composition at least one of absorbs energy, releases energy, or exhibiting damping behavior upon the application and removal of a mechanical stress at a temperature that is greater than 200° C.

11. An engine comprising:
    at least one component including at least one surface; and
    at least one thermal barrier coating at least partially coating at least a portion of the at least one surface of the at least one component, the at least one thermal barrier coating including the ferroelectric ceramic composition of claim 1.
12. The engine of claim 11, wherein the at least one component includes at least one of a piston crown, a valve, a cylinder cover, or a cylinder wall.
13. A turbine comprising:
    at least one component including at least one surface; and
    at least one thermal barrier coating at least partially coating at least one of the one or more surfaces of the one or more components, the at least one thermal barrier coating including the ferroelastic ceramic composition of claim 1.
14. The turbine of claim 13, wherein the at least one component include a turbine blade.
15. The ferroelastic ceramic composition of claim 1, wherein X and Y are greater than zero and less than one.
16. A method of using a ferroelastic ceramic composition, the method comprising:
    applying a load to at least a portion of the ferroelastic ceramic composition, the ferroelastic ceramic composition including at least one compound having a relative chemical formula of $A_{(1-X-Y)}B_XC_YD$, wherein:
        an element A, an element B, and an element C are independently selected from different members of the group consisting of yttrium, lanthanum, cerium, praseodymium, neodymium, promethium, samarium, europium, gadolinium, terbium, dysprosium, holmium, erbium, thulium, ytterbium, and lutetium;
        an element D is selected from the group consisting of phosphate, niobate, or tungstate, wherein the phosphate is $PO_4$, the niobate is $NbO_3$, and the tungstate is $WO_4$;
        X is a number that is equal to or greater than zero and less than one; and
        Y is a number that is equal to or greater than zero and less than one;
        wherein X and Y are collectively less than one;
        wherein the ferroelastic ceramic composition is a single crystal; and
    after applying a load to at least a portion of the ferroelastic ceramic composition, removing the load the at least a portion of the ferroelastic ceramic composition aterial.
17. The method of claim 16, further comprising, before applying a load to at least a portion of a ferroelastic ceramic composition, heating the ferroelastic ceramic composition to a temperature greater than about 200° C.
18. The method of claim 17, wherein heating the ferroelastic ceramic composition includes heating the ferroelastic ceramic composition to a temperature of about 300° C. to about 1200° C.
19. The method of claim 16, further comprising, after removing the load from the at least a portion of the ferroelastic ceramic composition, repeating the acts of applying a load to at least a portion of the ferroelastic ceramic composition and removing the load from the at least a portion of the ferroelastic ceramic composition.

* * * * *